(12) United States Patent
Abbaszadeh et al.

(10) Patent No.: US 11,029,427 B2
(45) Date of Patent: Jun. 8, 2021

(54) METHOD AND SYSTEM FOR INCREASING RADIATION SENSITIVITY IN SEMICONDUCTOR DETECTORS

(71) Applicants: The Board of Trustees of the University of Illinois, Urbana, IL (US); The Board of Trustees of the Leland Stanford Junior University, Stanford, CA (US)

(72) Inventors: Shiva Abbaszadeh, Champaign, IL (US); Garry Chinn, San Mateo, CA (US); Craig Levin, Palo Alto, CA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 38 days.

(21) Appl. No.: 16/664,613

(22) Filed: Oct. 25, 2019

(65) Prior Publication Data

US 2020/0150293 A1    May 14, 2020

Related U.S. Application Data

(60) Provisional application No. 62/758,738, filed on Nov. 12, 2018.

(51) Int. Cl.
*G01T 1/24* (2006.01)
*G01T 1/29* (2006.01)
*H01L 31/0296* (2006.01)

(52) U.S. Cl.
CPC ...... *G01T 1/2985* (2013.01); *H01L 31/02966* (2013.01)

(58) Field of Classification Search
CPC .. G01T 1/2985; G01T 1/249; H01L 31/02966
See application file for complete search history.

(56) References Cited

U.S. PATENT DOCUMENTS 6,484,051 B1   11/2002  Kurfess
7,321,122 B2    1/2008  Bryman
(Continued)

OTHER PUBLICATIONS

Lee, K et al., "Development of X-Ray and Gamma-Ray CZT Detectors for Homeland Security Applications", SPIE Defense, Security and Sensing (International Society for Optics and Photonics), Apr. 29, 2010.

(Continued)

*Primary Examiner* — Kiho Kim
(74) *Attorney, Agent, or Firm* — Guntin & Gust, PLC; Matthew Tropper

(57) ABSTRACT

Measuring in a first semiconductor crystal two anode channels and two cathode channels and measuring in a second semiconductor crystal one anode channel and one cathode channel; responsive to an energy of a sum of the two anode channels being within an energy window and an energy of the one anode channel being within the energy window: separating the two anode channels and the two cathode channels into combinations of anode-cathode channel pairs; for each of the anode-cathode channel pairs, determining a respective direction difference angle, each respective direction difference angle being determined via use of the one anode channel and one cathode channel; determining a determined one of the direction difference angles that has a smallest value; and setting as an initial interaction position of a photon a selected one of the anode-cathode channel pairs that corresponds to the determined direction difference angle. Additional embodiments are disclosed.

20 Claims, 28 Drawing Sheets

(56) References Cited

U.S. PATENT DOCUMENTS

| | | | |
|---|---|---|---|
| 7,968,850 | B2 | 6/2011 | Chinn et al. |
| 8,063,380 | B2 | 11/2011 | Levin et al. |
| 8,274,054 | B2 | 9/2012 | Pratx et al. |
| 8,575,534 | B2 | 11/2013 | Olcott et al. |
| 9,269,838 | B2 | 2/2016 | Karim et al. |
| 9,306,108 | B2 | 4/2016 | Doki et al. |
| 2002/0134942 | A1* | 9/2002 | Pehl ............... G01T 1/2985 250/369 |
| 2009/0072156 | A1* | 3/2009 | Chinn ............ G01T 1/2985 250/363.04 |
| 2010/0108894 | A1* | 5/2010 | Pratx ............. G01T 1/2985 250/362 |

OTHER PUBLICATIONS

Abbaszadeh, Shiva et al., "Characterization of a Sub-Assembly of 3D Position Sensitive Cadmium Zinc Telluride Detectors and Electronics From a Sub-Millimeter Resolution PET System", Physics in Medicine and Biology 61, Aug. 2016, pp. 6733-6753.

Abbaszadeh, Shiva et al., "First Acquisition of Data From a Prototype 3D Position Sensitive CZT PET System", IEEE Nuclear Science Symp. and Medical Imaging Conf, Nov. 2014, pp. 1-2.

Abbaszadeh, Shiva et al., "New-Generation Small Animal Positron Emission Tomography System for Molecular Imaging", Journal of Medical Imagining, vol. 4(1), Jan. 2017, 9 pages.

Abbaszadeh, Shiva et al., "Positioning True Coincidences That Undergo Inter-and Intra-Crystal Scatter for a Sub-MM Resolution Cadmium Zinc Telluride-Based PET System", IPEM, Physics in Medicine & Biology, Jan. 9, 2018, 12 pages.

Bindseil, Geron, "Approaches Toward Combining Positron Emission Tomography With Magnetic Resonance Imaging", PhD Thesis University of Western Ontario, Aug. 7, 2013, 216 pages.

Champley, Kyle M. et al., "Statistical Lor Estimation for a High-Resolution DMICE PET Detector", Physics in Medicine and Biology, Oct. 7, 2009, pp. 6369-6382.

Cherry, S R. et al., "Physics in Nuclear Medicine (Positron Emission Tomography) Chapter 18", 2012, pp. 447-477.

Chinn, G et al., "A Maximum NEC Criterion for Compton Collimation to Accurately Identify True Coincidences in PET", IEEE Transactions on Medical Imaging, vol. 30, Issue 7, Oct. 2, 2011, pp. 1341-1352.

Comanor, K A. et al., "Algorithms to Identify Detector Compton Scatter in PET Modules", Submitted to IEEE Transactions on Nuclear Science, Lawrence Berkeley Laboratory, University of California, Nov. 1, 1995, pp. 1-5.

Cui, J Y. et al., "Fully 3D List-Mode Time-Of-Flight PET Image Reconstruction on GPUS Using CUDA", Dec. 2011, pp. 6775-6786.

Gu, Y et al., "Characterization of Inter-Detector Effects in a 3D Position-Sensitive Dual-CZT Detector Modules for PET", IEEE, Nuclear Science Symposium and Medical Imaging Conference, Oct. 2012, pp. 4088-4090.

Gu, Y et al., "Studies of Electrode Design for a Sub-MM Resolution 3D Position Sensitive CZT PET Detector", IEEE Nuclear Science Symp. Conf. Record, 2011, pp. 2303-2305.

Gu, Y et al., "Study of a High-Resolution, 3D Positioning Cadmium Zinc Telluride Detector for PET", Physics in Medicine and Biology, Feb. 2011, pp. 1563-1584.

Gu, Y et al., "Study of Electrode Pattern Design for a CZT-Based PET Detector", May 1, 2014, 24 pages.

Jan, Sama et al., "Gate: A Simulation Toolkit for PET and SPECT", Physics in Medicine and Biology, Nov. 2004, pp. 4543-4561.

Kalemci, E et al., "Investigation of Charge Sharing Among Electrode Strips for a CDZNTE Detector", Center for Astrophysics and Space Sciences, University of California, Mar. 6, 2001, 16 pages.

Kalemci, E et al., "Model Calculations of the Response of CZT Strip Detectors", SPIE's Int. Symp on Optical Science, Engineering and Instrumentation (International Society for Optics and Photonics), 1999, pp. 360-373.

Kim, Jae C. et al., "Improvement of Sub-Pixel Position Sensing in Nonuniform Large-Volume Pixelated CDZNTE Crystals", IEEE Transactions on Nuclear Science, vol. 60, No. 2, Apr. 2013, pp. 1201-1207.

Matteson, James L. et al., "Charge Collection Studies of a High Resolution CZT-Based Detector for PET", IEEE Nuclear Science Symposium Conference Record, 2008, pp. 503-510.

Pratx, Guillem et al., "Bayesian Reconstruction of Photon Interaction Sequences for High-Resolution PET Detectors", Physics in Medicine and Biology, Sep. 2009, pp. 5073-5094.

Yoon, Changyeon et al., "Simulation for CZT Compton PET (Maximization of the Efficiency for PET Using Compton Event)", Nuclear Instruments and Methods in Physics Research Section A Accelerators Spectrometers Detectors and Associated Equipment, Oct. 2011, pp. 713-716.

* cited by examiner

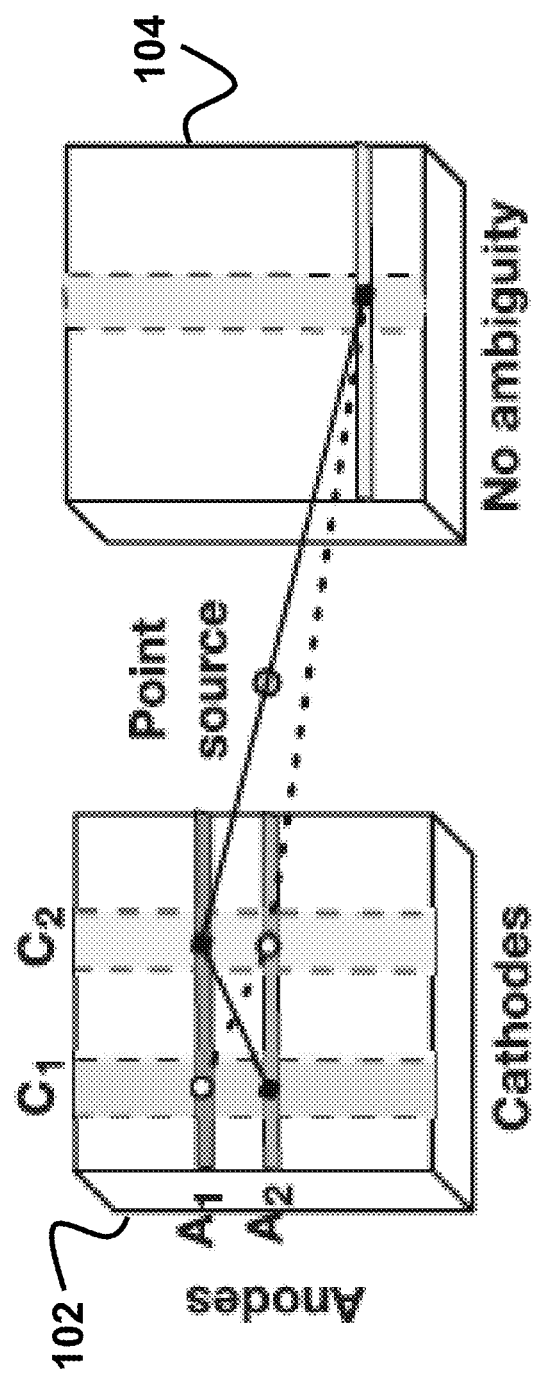
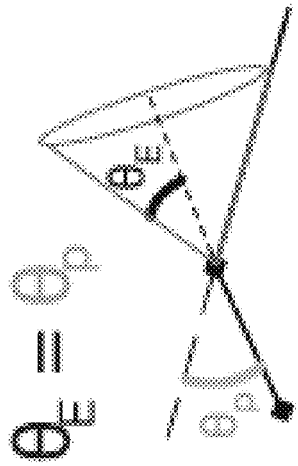
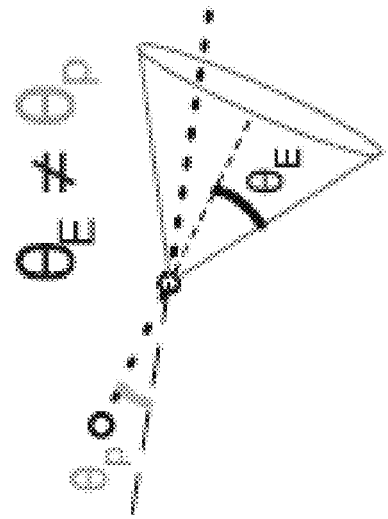
FIG. 1

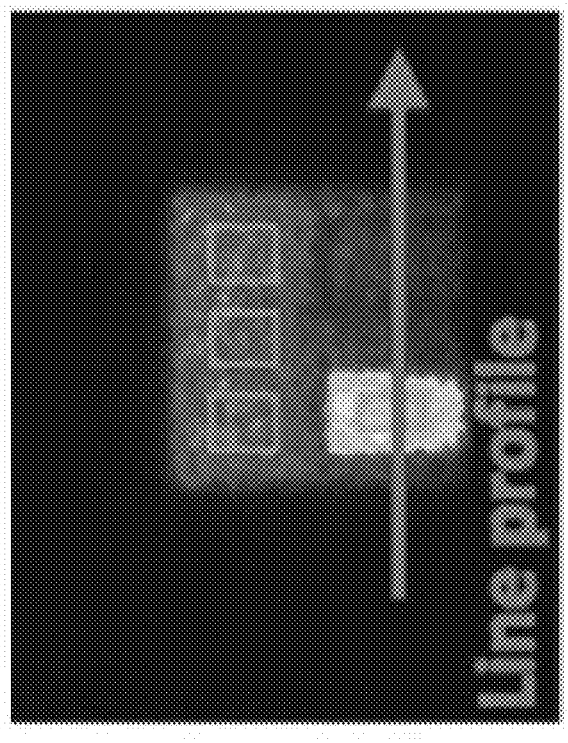
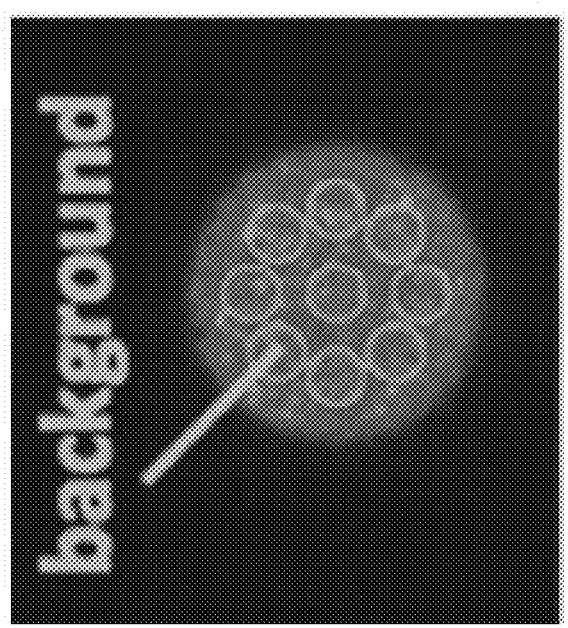
FIG. 8

```
┌─────────────────────────────────────────────────────────────┐
│ Measuring in a first semiconductor crystal of a plurality of semiconductor │
│ crystals two anode channels and two cathode channels and measuring in │
│ a second semiconductor crystal of the plurality of semiconductor crystals │
│ one anode channel and one cathode channel                   │
│                                                    1502     │
└─────────────────────────────────────────────────────────────┘
                              │
                              ▼
┌─────────────────────────────────────────────────────────────┐
│ Determining whether an energy of a sum of the two anode channels of the │
│ first semiconductor crystal is within an energy window      │
│                                                    1504     │
└─────────────────────────────────────────────────────────────┘
                              │
                              ▼
┌─────────────────────────────────────────────────────────────┐
│ Determining whether an energy of the one anode channel of the second │
│ semiconductor crystal is within the energy window     1506  │
└─────────────────────────────────────────────────────────────┘
                              │
                              ▼
┌─────────────────────────────────────────────────────────────┐
│ Responsive to the energy of the sum of the two anode channels of the first │
│ semiconductor crystal being within the energy window and the energy of │
│ the one anode channel of the second semiconductor crystal being within │
│ the energy window: separating the two anode channels and the two │
│ cathode channels of the first semiconductor crystal into combinations of │
│ anode-cathode channel pairs; for each of the anode-cathode channel pairs │
│ of the first semiconductor crystal, determining a respective direction │
│ difference angle, each respective direction difference angle being │
│ determined via use of the one anode channel and one cathode channel of │
│ the second semiconductor crystal; determining from among the direction │
│ difference angles a determined one of the direction difference angles that │
│ has a smallest value; and setting as an initial interaction position of a │
│ photon a selected one of the anode-cathode channel pairs that │
│ corresponds to the determined direction difference angle that has the │
│ smallest value                                              │
│                                                    1508     │
└─────────────────────────────────────────────────────────────┘
```

```
┌─────────────────────────────────────────────────────────────────────────┐
│ Measuring in a first one of the semiconductor crystals one or more anode│
│ channels and one or more cathode channels and measuring in a second one │
│ of the semiconductor crystals one or more anode channels and one or more│
│ cathode channels                                                   1602 │
└─────────────────────────────────────────────────────────────────────────┘
                                    │
                                    ▼
┌─────────────────────────────────────────────────────────────────────────┐
│ Determining whether an energy of a sum of the one or more anode channels│
│ of the first semiconductor crystal is within an energy window      1604 │
└─────────────────────────────────────────────────────────────────────────┘
                                    │
                                    ▼
┌─────────────────────────────────────────────────────────────────────────┐
│ Determining whether an energy of a sum of the one or more anode channels│
│ of the second semiconductor crystal is within the energy window    1606 │
└─────────────────────────────────────────────────────────────────────────┘
                                    │
                                    ▼
┌─────────────────────────────────────────────────────────────────────────┐
│ Responsive to the energy of the sum of the one or more anode channels of│
│ the first semiconductor crystal being within the energy window and the  │
│ energy of the sum of the one or more anode channels of the second       │
│ semiconductor crystal being within the energy window: separating the one│
│ or more anode channels and the one or more cathode channels of the first│
│ semiconductor crystal into first combinations of anode-cathode channel  │
│ pairs; separating the one or more anode channels and the one or more    │
│ cathode channels of the second semiconductor crystal into second        │
│ combinations of anode-cathode channel pairs; creating a plurality of    │
│ sequences of interaction points from the first combinations of anode-   │
│ cathode channel pairs of the first semiconductor crystal; creating a    │
│ plurality of sequences of interaction points from the second            │
│ combinations of anode-cathode channel pairs of the second semiconductor │
│ crystal; for each of the plurality of sequences in the first            │
│ semiconductor crystal, determining a respective direction difference    │
│ angle via use of each of the plurality of sequences of the second       │
│ semiconductor crystal; determining from among the direction difference  │
│ angles a determined one of the direction difference angles that has a   │
│ smallest value; and setting, as initial interaction positions of        │
│ photons, selected ones of the anode-cathode channel pairs that          │
│ correspond to a sequence that has the determined direction difference   │
│ angle that has the smallest value                                  1608 │
└─────────────────────────────────────────────────────────────────────────┘
```

```
┌─────────────────────────────────────────────────────────────────┐
│ Measuring in a first crystal two or more channels and measuring │
│ in a second crystal one or more channels                        │
│                                                            1702 │
└─────────────────────────────────────────────────────────────────┘
                                │
                                ▼
┌─────────────────────────────────────────────────────────────────┐
│ Determining whether an energy of a sum of the two or more       │
│ channels of the first crystal is within an energy window        │
│                                                            1704 │
└─────────────────────────────────────────────────────────────────┘
                                │
                                ▼
┌─────────────────────────────────────────────────────────────────┐
│ Determining whether an energy of a sum of the one or more       │
│ channels of the second crystal is within the energy window      │
│                                                            1706 │
└─────────────────────────────────────────────────────────────────┘
                                │
                                ▼
┌─────────────────────────────────────────────────────────────────┐
│ Responsive to the energy of the sum of the two or more channels │
│ of the first crystal being within the energy window and the     │
│ energy of the sum of the one or more channels of the second     │
│ crystal being within the energy window: creating a plurality of │
│ sequences of interaction points from the two or more channels   │
│ of the first crystal; creating one or more sequences of         │
│ interaction points from the one or more channels of the second  │
│ crystal; for each of the plurality of sequences in the first    │
│ crystal, determining a respective direction difference angle    │
│ via use of each of the one or more sequences of the second      │
│ crystal; determining from among the direction difference angles │
│ a determined one of the direction difference angles that has a  │
│ smallest value; and setting, as initial interaction positions   │
│ of photons, selected ones of the channels that correspond to a  │
│ sequence that has the smallest direction difference angle       │
│                                                            1708 │
└─────────────────────────────────────────────────────────────────┘
```

METHOD AND SYSTEM FOR INCREASING RADIATION SENSITIVITY IN SEMICONDUCTOR DETECTORS

CROSS-REFERENCE TO RELATED APPLICATION(S)

The present application claims the benefit of priority to U.S. Provisional Patent Application No. 62/758,738, filed on Nov. 12, 2018, the disclosure of which is incorporated by reference herein in its entirety.

STATEMENT REGARDING FEDERALLY SPONSORED RESEARCH OR DEVELOPMENT

This invention was made with government support under R01 EB028091, CA120474 and CA118681 awarded by the National Institutes of Health. The government has certain rights in the invention.

FIELD OF THE DISCLOSURE

The subject disclosure relates generally to a method and system for increasing radiation sensitivity in semiconductor detectors. In one or more embodiments, provided are a method and system for positioning true coincidences that undergo inter- and intra-crystal scatter for a sub-mm resolution cadmium zinc telluride-based PET apparatus.

BACKGROUND

Cadmium zinc telluride (CZT) is a wide band gap compound semiconductor that is attractive for room temperature, photon counting, energy resolving radiation detection in x-ray and gamma imaging, positron emission tomography (PET) and single photon computed tomography (SPECT). It has a relatively high effective atomic number ($Z_{CZT}$=48.2) with density of 5.78 g cm$^{-3}$ that provides high stopping power for x-rays and gamma-rays. It enables direct conversion of the absorbed high energy photons into electronic signals and better energy resolution than scintillator detectors. Different electrode geometries with very small pixel arrays (<100 μm) can be reliably fabricated by depositing metal on CZT which eliminates the complexity of cutting tiny crystal segments in scintillator detector technology.

One electrode configuration frequently used in CZT detector is a cross-strip pattern (see Kalemci and Matteson 2002, Lee et al 2010, Gu and Levin 2014). [Fuller citations of each of the references parenthetically cited in the specification are provided below]. This configuration provides an efficient way to achieve a fewer number of electronic readout channels (i.e., 2n versus n$^2$) through the electrode pattern and it can achieve high spatial resolution in three dimensions (3D). This presents an advantage in terms of channel density and physical form factor for the detector hardware design. The intersection of the anode and cathode strips that produce signals defines the x-y localization of photon interactions. In addition, cathode-to-anode signal ratio and/or charge drift time can be used to accurately estimate the position of photon interaction in the z direction (see Kalemci et al 1999).

In PET imaging, a coincidence event is assigned to a line of response (LOR) which is determined as the line through the detected positions in two opposing detector elements. At high energy (511 keV), CZT has a larger mass attenuation coefficient for Compton scatter than for photoelectric absorption and there are a large fraction of multiple interaction photon events (MIPEs). One challenge of using the cross-strip electrode configuration is finding the correct intersection between anode and cathode strips when multiple anodes and cathodes generate signals at the same time. This is an important problem in the case of large volume CZT detectors where a large percentage of MIPEs happen within the same CZT crystal slabs. These intra-crystal scatter event types are typically discarded since there conventionally has not been an accurate method to position the anode-cathode pairs.

Several approaches have been investigated for identifying the first interaction in MIPEs (see Comanor et al 1996, Pratx and Levin 2009, Champley et al 2009, Chinn and Levin 2011, Yoon et al 2011, Kim et al 2013) such as energy-weighted spatial mean, Compton kinematics, and Bayesian reconstruction. However, all of the aforementioned approaches consider a pixelated crystal when the position of MIPEs are defined and there is no position ambiguity on how to pair multiple triggered anodes and cathodes.

BRIEF DESCRIPTION OF THE DRAWINGS

Reference will now be made to the accompanying drawings, which are not necessarily drawn to scale, and wherein:

FIG. 1 shows, according to one or more embodiments, a diagram, related to positioning ambiguity for MIPEs that occur within the same crystal. Comparing $\theta_E$ and $\theta_p$ (see equations (1) and (2) below) enables choosing of the first interaction position. An example situation is illustrated where two anodes and two cathodes are triggered on one of the crystals. Two interaction sets in that crystal are shown, each using a different anode/cathode pair as the first interaction position. In one case, $\theta_E \mathrel{!}= \theta_p$, while in the other $\theta_E = \theta_p$. In the latter case, the LOR passes through the point source.

FIG. 8 shows, according to one or more embodiments, reconstructed image of contrast phantom where the hot and background regions are defined for calculating the CNR (contrast-to-noise ratio).

FIG. 15 depicts an illustrative embodiment of a method in accordance with various aspects described herein.

FIG. 16 depicts an illustrative embodiment of a method in accordance with various aspects described herein.

FIG. 17 depicts an illustrative embodiment of a method in accordance with various aspects described herein.

DETAILED DESCRIPTION

Figure 2:
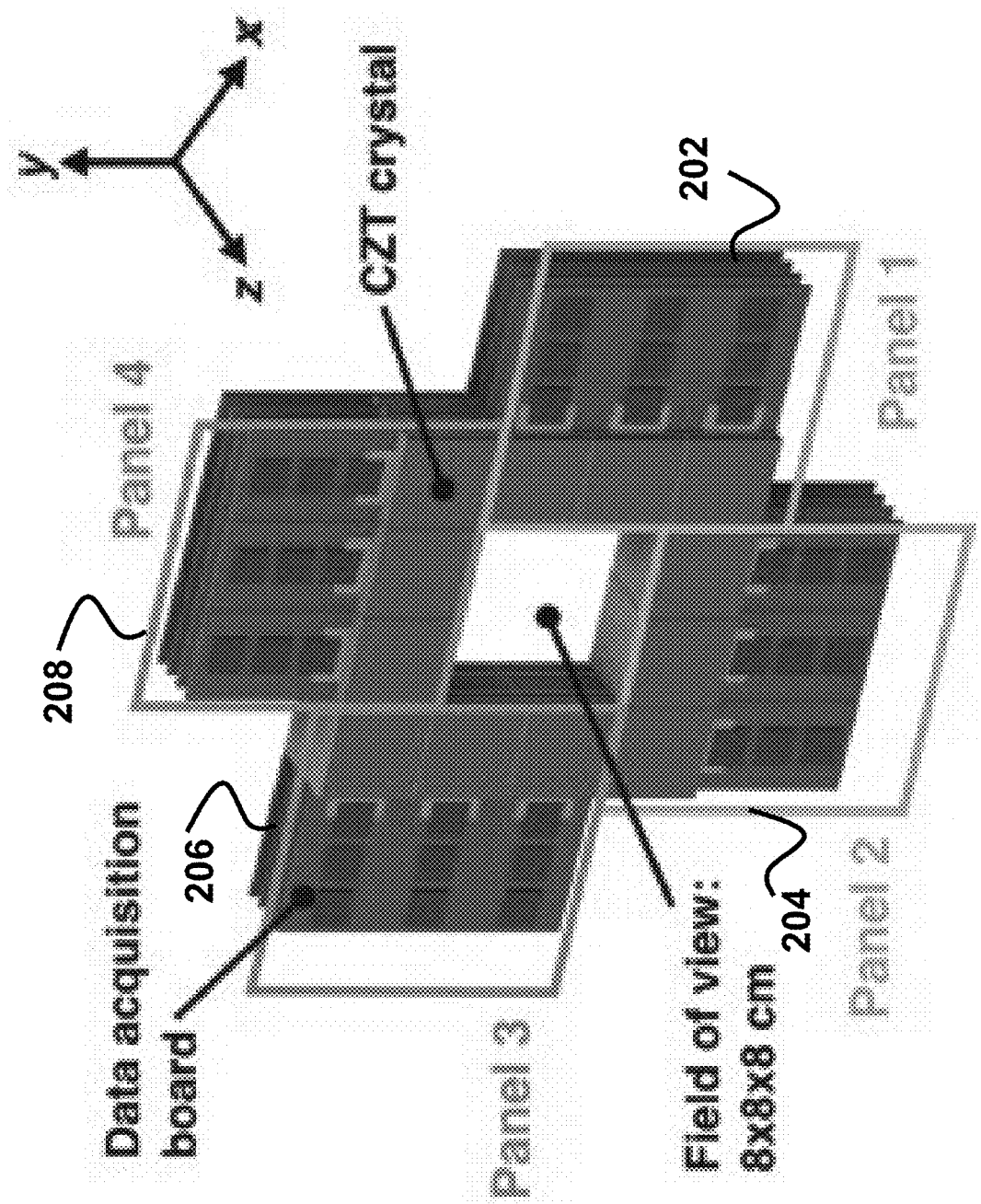
FIG. 2 shows, according to one or more embodiments, a schematic of a box-shaped CZT-based small animal PET system.

As described herein, one or more embodiments provide a method (and associated system) that employs Compton kinematics in a data processing algorithm to pair the correct anode and cathode channels corresponding to first interaction position in intra-crystal scatter events. In one or more embodiments, the same method (and associated system) is applied to positioning inter-crystal scatter events. The effect of the energy threshold of the system (i.e., the level of a signal that triggers the acquisition for individual interactions) on the capability of the system to accurately detect the first interaction position of MIPEs was investigated by simulating a system and changing the energy threshold and calculating the contrast-to-noise ratio (CNR).

As described herein, one or more embodiments provide for improvement in the sensitivity of PET, by retaining intra-crystal MIPEs. If the position and sequence of both intra- and inter-crystal MIPEs is accurately determined, the detection efficiency of the system can be significantly improved.

As described herein, one or more embodiments can be applicable to any multiplexing that can resolve MIPEs. As described herein, one or more embodiments can be applicable to any situation in which there is channel reduction and MIPEs (e.g., ambiguous cases that need a resolving such as to prevent an event from being discarded). As described herein, one or more embodiments can be applicable to any detector that is capable of recording multiple interaction events.

Reference will now be made to certain materials and methods according to one or more embodiments. In particular, reference will now be made to identifying anode-cathode pair position in intra-crystal MIPEs. In a cross-strip electrode pattern, the x-y localization of photon interaction is achieved by finding the intersection of the anode-cathode pair strips producing a signal. The interaction coordinate orthogonal to the cathode and anode (z localization) is achieved using the ratio of cathode signal to anode signal (C/A ratio). Intra-crystal Compton scatter causes the annihilation photon to deposit energy in multiple interaction locations within the relatively large volume of CZT crystal. FIG. 1 shows an example of an incident photon that undergoes one Compton scatter (C) with a following photoelectric (P) absorption within one cross-strip CZT detector, depicting a potential positioning ambiguity (see detector 102), and a single interaction (without ambiguity) in the other detector (see detector 104).

In the data processing chain, there is a sorting stage to find the anode and cathode strips within one detector that get triggered within a time window. In a conventional approach (mentioned above), if there is more than one anode and one cathode channel triggered, they are discarded since there is ambiguity on pairing the correct anode-cathode strips corresponding to the first interaction location. However, various embodiments described herein utilize the direction difference angle (DDA) (Chinn and Levin 2011) defined as $\theta_{DDA}=|\theta_E-\theta_P|$ to select the correct anode-cathode pair corresponding to the first interaction position. The Compton scattering angle $\theta_E$ is determined using equation (1):

$$\theta_E = \cos^{-1}\left(1 - mc^2\left(\frac{1}{E_s} - \frac{1}{E_i}\right)\right) \quad (1)$$

where $mc^2$ is the photon rest energy, $E_i$ is the incident photon energy and $E_s$ is the scattered photon energy. The $\theta_p$ is determined as the angle between the incident and scattered photon using the equation (2):

$$\theta_p = \cos^{-1}\left(\frac{A \cdot B}{|A \cdot B|}\right) \quad (2)$$

where A and B are the vectors of the incident and scattered photons (using location information of the registered events). Table 1 below shows all the possible anode-cathode pairing for identifying the first interaction location in FIG. 1. Since the Compton scattering angle is determined based on the anode energy, $\theta_E$ remains the same for both $A_1C_1$ or $A_1C_2$ positions. However, $\theta_p$ and as a consequence the DDA angle will change. FIG. 1 indicates that the wrong set of anode-cathode pair led to a larger DDA. As a consequence a simple, fast algorithm according to one or more embodiments is to consider all possible interaction sets and determine the anode-cathode pair with the lowest $\theta_{DDA}$ below an angular threshold ($\theta_t$). GATE simulations were used to determine $\theta_t$ to maximize the following figure of merit, NECm, inspired by noise equivalent counts:

$$\underset{\theta_i}{\operatorname{argmax}} NECm = \underset{\theta_i}{\operatorname{argmax}} \frac{T^2}{T + R + C + S}, \quad (3)$$

where T is the number of correctly positioned trues, R is the number of randoms, S is the number of detected events assigned to the system LORs that have undergone scatter in the phantom, and C is the number of mispositioned trues due to loss of first or second MIPEs (these MIPEs are lost since their energy is below the lower energy threshold of the system). The C term has been added to incorporate a penalty for reduction in CNR and resolution loss due to mispositioning.

TABLE 1

All the possible anode-cathode pair for identifying the first interaction location in FIG. 1

| Anode-cathode pair | $\theta_E$ | $\theta_P$ | $\theta_{DOA}$ |
|---|---|---|---|
| $A_1C_1$ | $\theta_{E1}$ | $\theta_{p1}$ | $\theta_{DOA1}$ |
| $A_1C_2$ | $\theta_{E1}$ | $\theta_{p2}$ | $\theta_{DOA2}$ |
| $A_2C_1$ | $\theta_{E2}$ | $\theta_{p3}$ | $\theta_{DOA3}$ |
| $A_2C_2$ | $\theta_{E2}$ | $\theta_{p4}$ | $\theta_{DOA4}$ |

As described herein, considered were the MIPEs that are due to a Compton event followed by a photoelectric absorption. In the illustration in FIG. 1, two anodes and two cathodes are triggered. Since there are 2 anodes and 2 cathodes, it is possible to calculate the depth of interaction for any possible anode-cathode pairing. There are other possible scenarios that the z coordinate using the C/A ratio cannot be determined: (i) Same anode and same cathode are triggered for both interactions. These events correspond to single voxel MIPEs since in the measurement they cannot be differentiated as separate interactions. (ii) One anode and two cathodes are triggered. (iii) Two anodes and one cathodes are triggered.

Still referring to certain materials and methods according to one or more embodiments, reference will now be made to a CZT PET system. In one or more embodiments a small animal positron emission tomography (PET) system based on cross-strip CZT detectors configured to achieve high spatial resolution and high sensitivity is provided (FIG. 2) (see Matteson et al 2008, Gu and Levin 2011, Gu et al 2011, Gu and Levin 2012, 2014, Abbaszadeh et al 2014, 2016, Abbaszadeh and Levin 2017). The system of this embodiment comprises four panels providing an adjustable, box-shaped field of view with maximum field-of-view (FOV) of 100 mm×100 mm×80 mm. Each panel (see elements 202, 204, 206, 208) includes 48 tightly stacked 40 mm×40 mm×5 mm crystals arranged in an edge-on orientation. The CZT detector orientation of this embodiment (edge-on with only 50 um gaps) increases 511 keV photon detection efficiency. The CZT crystals are metallized with a cross-strip electrodes pattern (1 mm pitch anode strips with steering electrode strips in between on one face, and 5 mm pitch cathode strips on the other (see Gu and Levin 2014)). The cross-strip configuration reduces the number of electronic readout channels required for the same detector area compared to a fully pixelated anode while providing excellent spatial resolution (<1×5 mm² in x-y plane, and <1 mm in z direction). The initial performance characterization of the prototype system with a 100 keV low energy threshold is summarized in Table 2 below (see Abbaszadeh et al 2016, Abbaszadeh and Levin 2017).

TABLE 2

CZT-based small animal initial system characterization.
Note that the spatial resolution includes the charge sharing effect.

| Energy resolution at 511 keV (FWHM) | 7.35 ± 1.75% |
|---|---|
| Intrinsic spatial resolution (tangential) | 0.78 ± 0.1 mm |
| Time resolution (FWHM) | 18 ± 0.1 ns |

When an interaction occurs, the drift of electron-hole pairs induces signals that triggers the anode and cathode channels. The readout electronics record the energy and time of the triggered channel. If there are MIPEs that occurs in two adjacent crystals, there is no position ambiguity. The anode-cathode pair in each crystal determine the x-y position and the C/A ratio determine the axial z position. However, if both interactions happened in the same crystals, one or more embodiments operate to further enumerate all possible interaction sequence ordering.

Figure 3A:
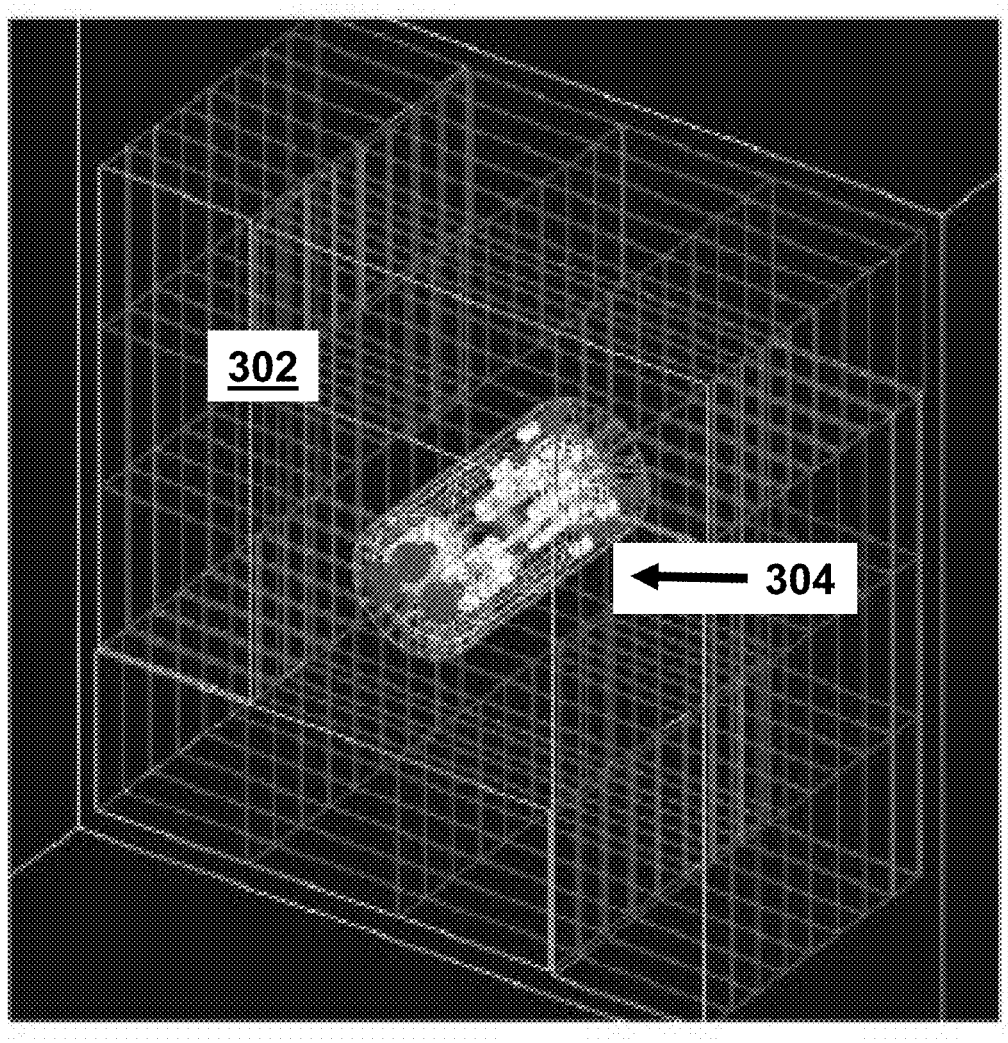
FIGS. 3A and 3B show, according to one or more embodiments, a CZT system (see generally the grid 302) and contrast phantom (see generally the inner portion 304) as modeled in GATE (Geant4 Application for Tomographic Emission).
Figure 3B:
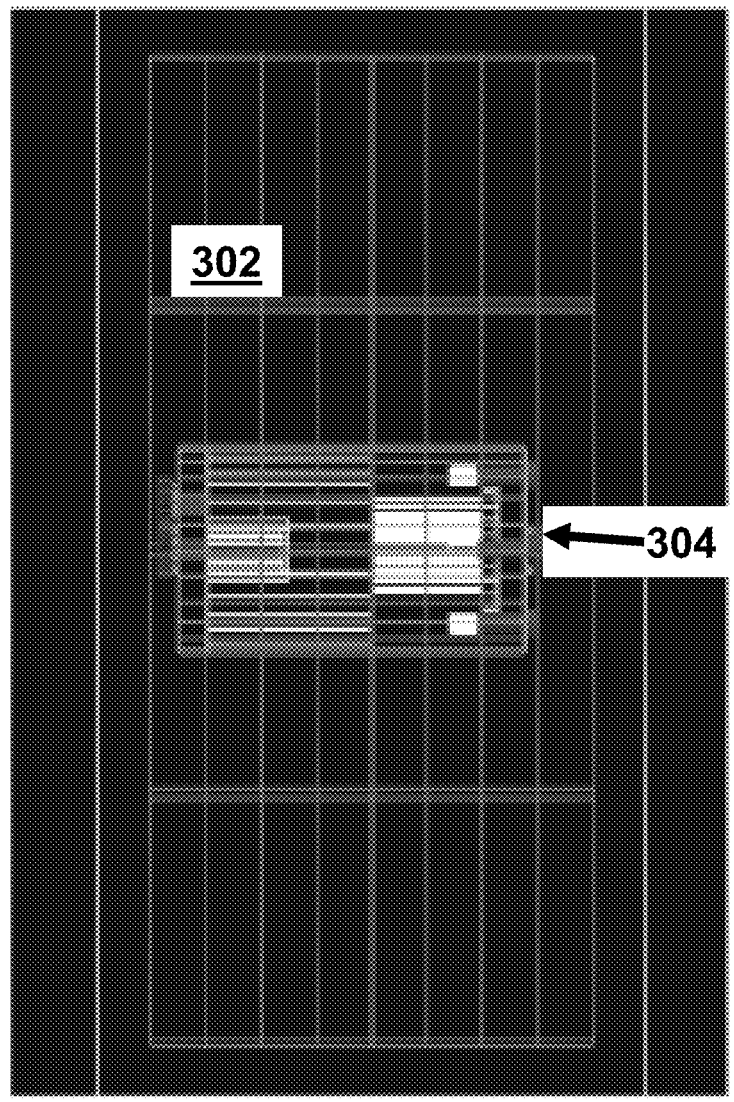
Figure 3C:
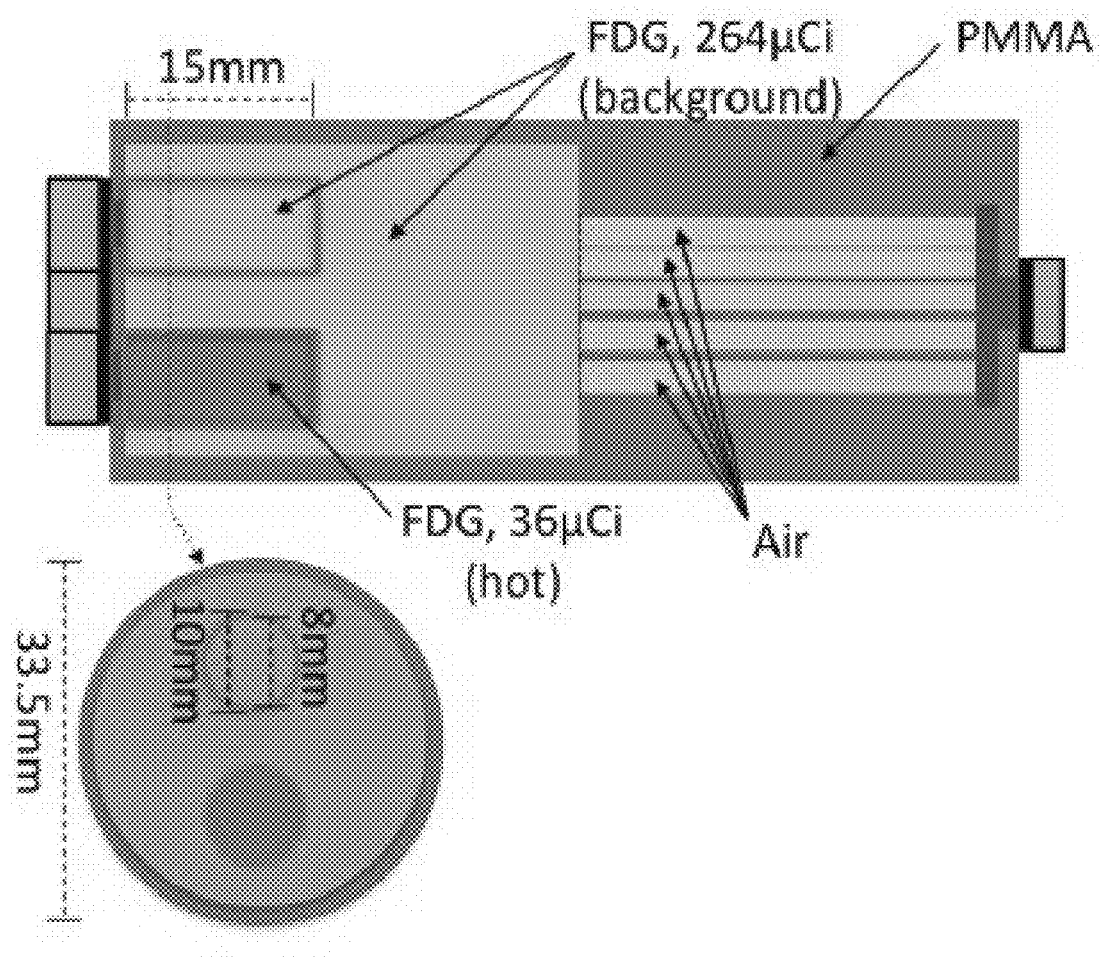
FIG. 3C shows, according to one or more embodiments, the activity concentration in the phantom of FIGS. 3A and 3B.

Still referring to certain materials and methods according to one or more embodiments, reference will now be made to a phantom. As described herein, a NEMA-NU4 2008 image quality mouse phantom (Bindseil 2013) was used in simulation for investigating contrast and noise. The base material was PMMA, a tissue-equivalent plastic. The main body and one of the fillable, cylindrical compartments were filled with a 264 μCi aqueous solution of $^{18}$F as background region, while the other fillable, cylindrical compartment was filled with an aqueous solution of $^{18}$F with an activity concentration 3.8 times the background concentration. The total activity was 300 μCi. The alignment of the phantom with respect to the system can be seen in FIG. 3.

Figure 4A:
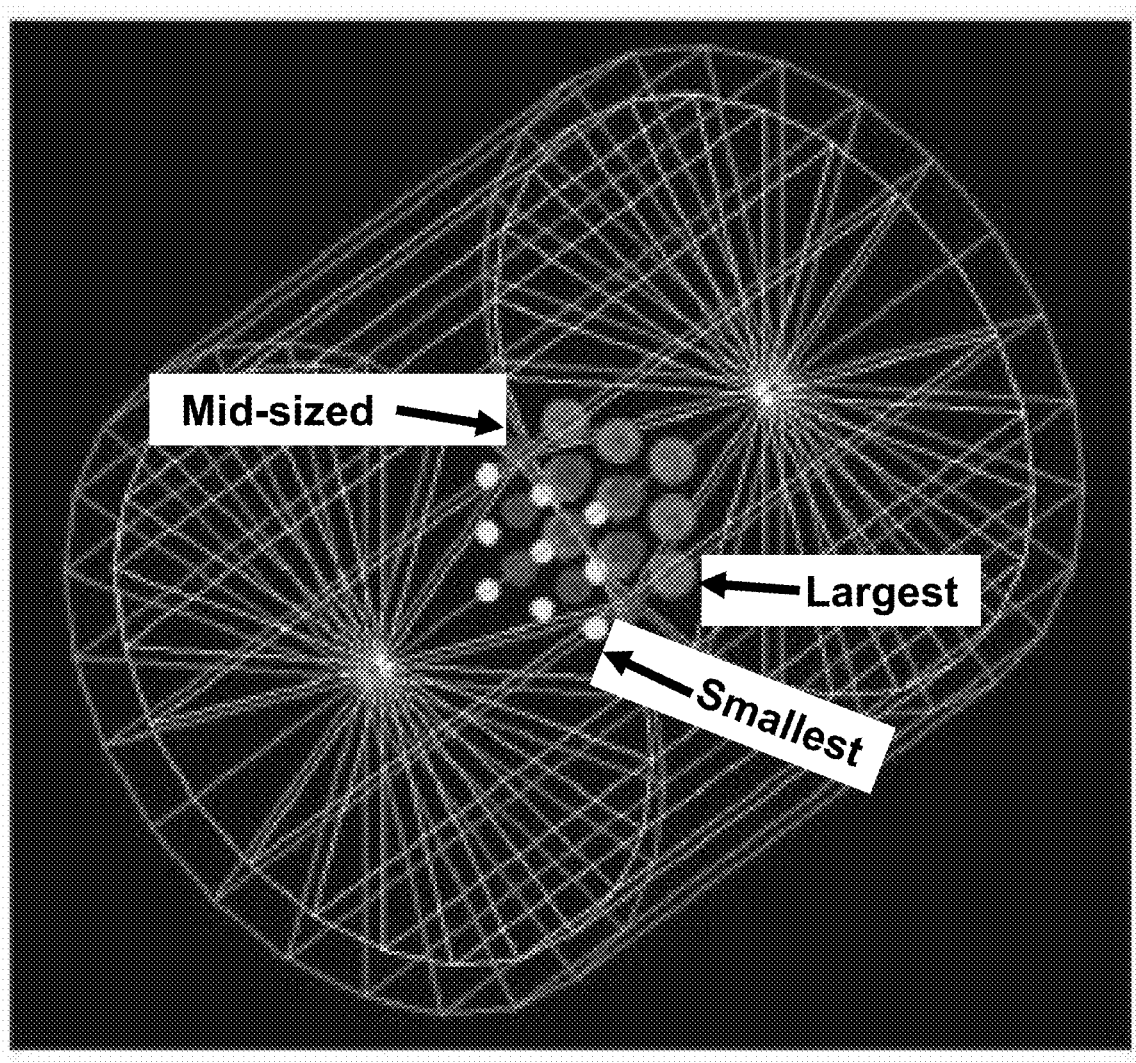
FIG. 4A shows, according to one or more embodiments, a point source phantom where the smallest, did-size and largest circles represent 1, 1.5, and 2 mm diameter hot spheres, respectively.
Figure 4B:
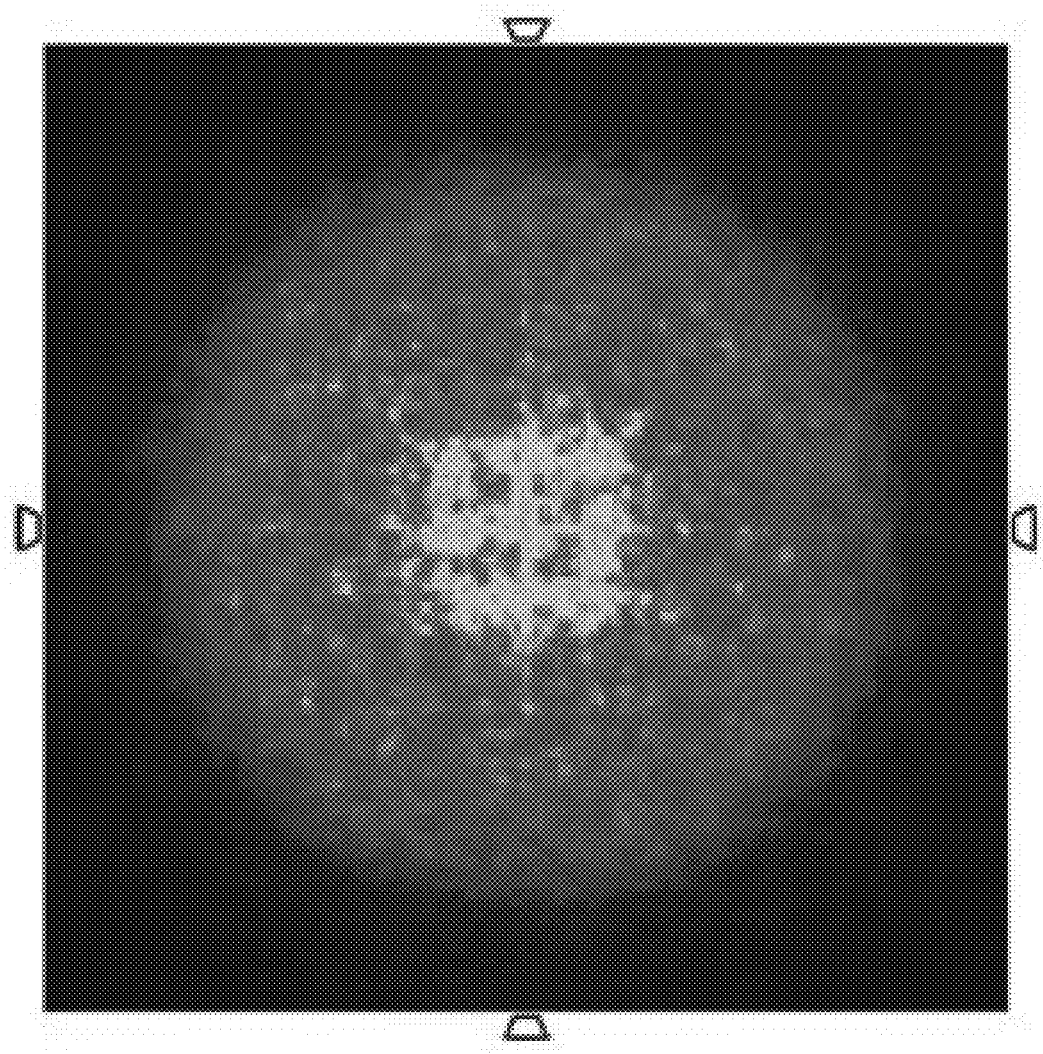
FIGS. 4B and 4C show, according to one or more embodiments, an example reconstructed image of the point source phantom (of FIG. 4A) from transaxial and coronal views, respectively.
Figure 4C:
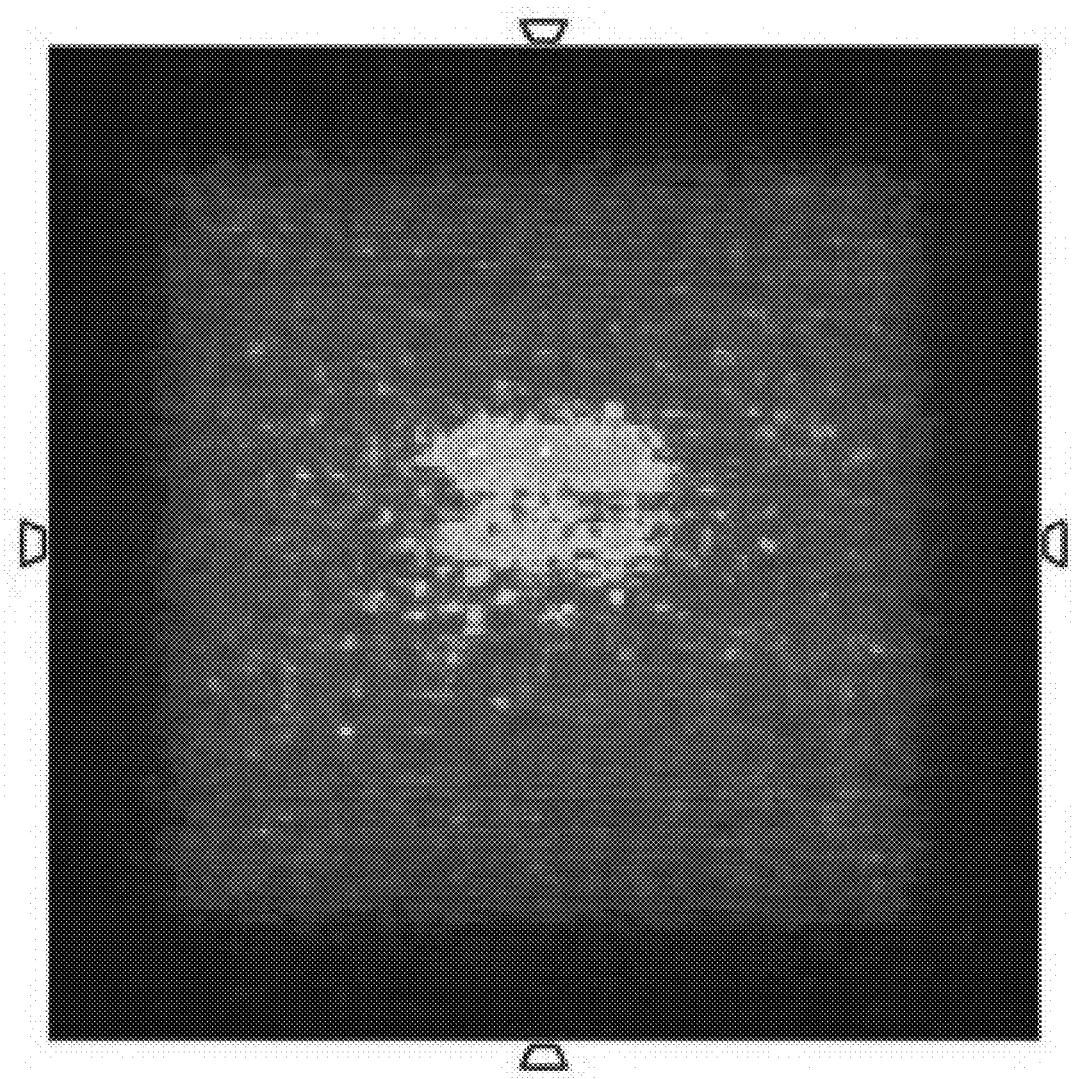

To investigate the spatial resolution, a second phantom was simulated that consisted of an array of hot point sources embedded in a warm background. Somewhat influenced by Pratx and Levin (2009), the point sources were 1, 1.5, and 2 mm in diameter. A 3×3 array of similar size point sources with 3 mm centre-to-centre spacing were placed in a warm background in a 30 mm inner-diameter PMMA cylinder (FIG. 4) with a 10:1 hot-to-background activity concentration ratio.

Still referring to certain materials and methods according to one or more embodiments, reference will now be made to a simulation setup. As described herein, GATE (see Jan et al 2004) was used to simulate the CZT PET system. A simulation time of 30 s was used for the phantom, with the duration chosen to achieve a statistical uncertainty of <3% in events assigned to LORs through all voxels (see Cherry et al 2012). The hit mode output file of the GATE simulation was processed to calculate the distribution of the interactions recorded in the CZT crystals. The deposited energy was blurred according to a Gaussian distribution based on the system overall FWHM energy resolution which depends on the FWHM of each individual source of energy variation in the prototype system (see Abbaszadeh et al 2016). The position in the x-y plane was binned according to the anode and cathode strips that recorded signal above the low energy threshold and the interactions were assigned to the centre of the strips. The thickness of the crystal was divided into 1 mm slices based on the conservative estimate of spatial resolution in the z direction (see Gu and Levin 2014). The z position was assigned to the centre of the slice. Based on initial characterization of the prototype (see Abbaszadeh et al 2016), the system energy resolution at 511 keV was 8%

FWHM. An energy window of ±16% around the photopeak (429-593 keV) was used, unless otherwise stated, because it yielded the highest CNR. A time window of 20 ns was used, also based on initial characterization (see Abbaszadeh et al 2016). Custom code (see FIG. 5) was developed according to one or more embodiments to sort the coincidences and to implement the Compton kinematics algorithm for events with two interactions: Compton scatter followed by the photoelectric interaction. In addition to the Compton kinematics method, the energy-weighted spatial mean method (see Comanor et al 1996, Pratx and Levin 2009) and random selection of first interaction were used for performance comparison. For image reconstruction, the following events were included:

Coincidences where photoelectric-only interactions (within the energy window) were identified in opposite detectors. These events are called PP.

Coincidences where on one side of the system, one interaction falls in the energy window and on the other side, two interactions (triggered in one CZT detector or two CZT detectors) deposited a combined energy within the energy window. These events are called PC or CP.

Coincidences where in both sides, two interactions (triggered in one CZT detector or two CZT detectors) deposited a combined energy within the energy window. These events are called CC.

The energy threshold ($E_{thresh}$) of the system, i.e. the level of a signal that triggers the acquisition, limits the capability of the system to detect MIPEs with individual interactions below the threshold. For example, using Compton kinematics and the Klein-Nishina formula as a cumulative distribution function, all scattering interactions with scatter angle below 40° will deposit less than 100 keV in the first interaction. These low energy interactions will remain undetected in a system that employs an energy threshold of 100 keV, which can make a two-interaction event effectively appear to be a single interaction event. In one or more embodiments described herein, four energy thresholds (10, 50, 100, 150 keV) were considered. That is, the events with energy below the energy threshold were filtered from the simulation data. Previously, a z resolution of <1 mm was observed (see Gu and Levin 2014) for all photon interactions above the energy threshold of the prototype system (100 keV). In one or more embodiments it is assumed that the readout electronics have been upgraded so that the z resolution of 1 mm based on the C/A ratio is achievable down to photons with energy of 10 keV.

Figure 5:
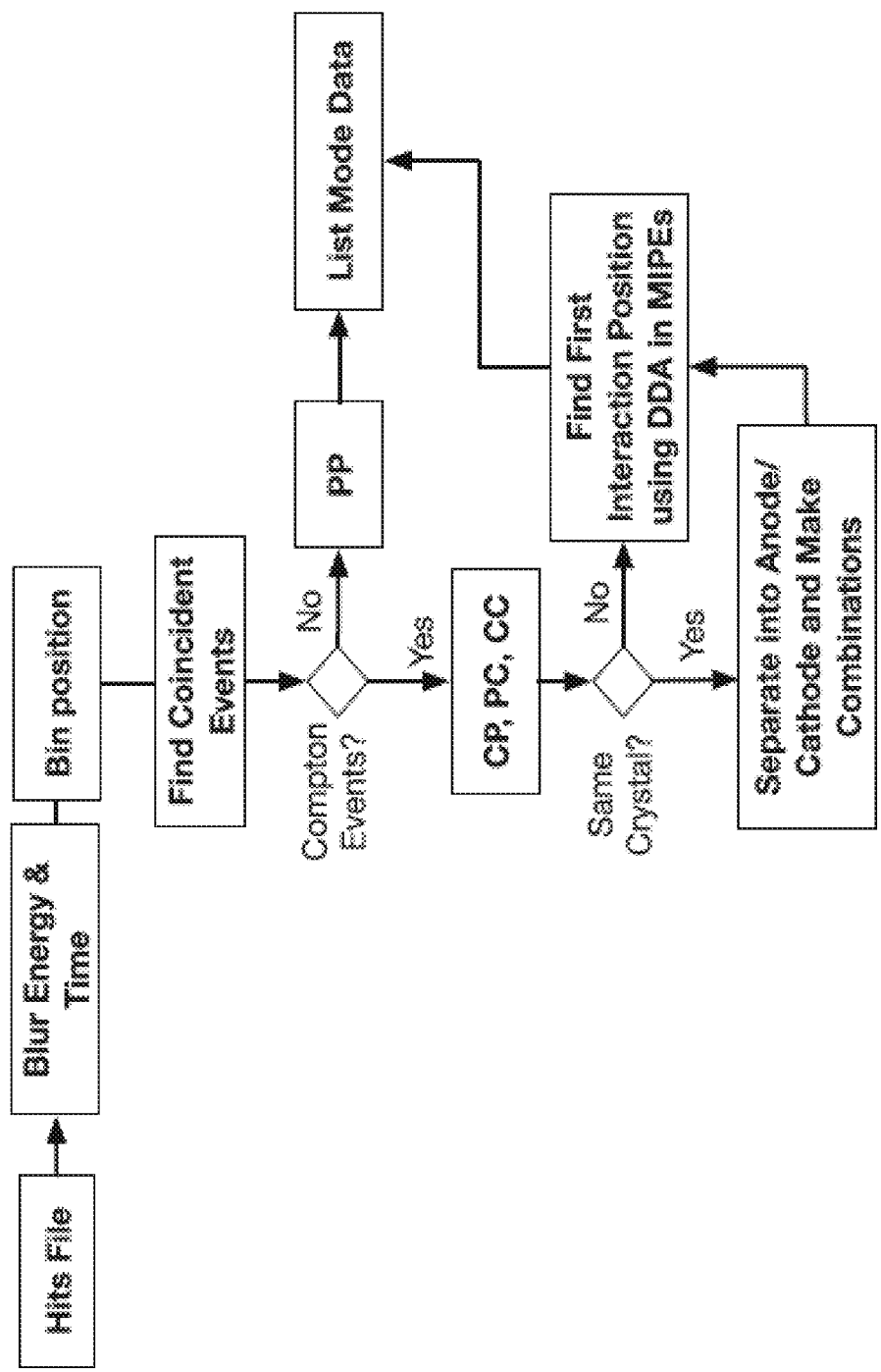
FIG. 5 shows, according to one or more embodiments, a flowchart of identification of first interaction position.

The flowchart in FIG. 5 illustrates the basic structure of the interaction positioning identification algorithm according to one or more embodiments. Note that for inter-crystal scatter since there is no anode-cathode pairing ambiguity (i.e. no position ambiguity) there is no need to separate the anode and cathodes into all possible combinations.

Still referring to certain materials and methods according to one or more embodiments, reference will now be made to a performance evaluation. As described herein, the effect of the energy threshold on the performance of the system including MIPEs was measured in terms of the CNR and system sensitivity. The system sensitivity was defined as the ratio (or percentage) of the number of events assigned to system LORs to the number of disintegrations.

A listmode OS-EM algorithm (see Cui et al 2011) was used to reconstruct images from the custom sorting code. The number of iterations for image reconstruction was chosen to maximize the CNR. The CNR and contrast were evaluated using the following equations:

$$CNR = \frac{I_{hot} - I_{background}}{\sigma_{background}}, \quad Contrast = \frac{I_{hot} - I_{background}}{I_{background}} \quad (4)$$

where $I_{hot}$ and $I_{background}$ represent the mean intensity in the uniform hot and mean count in the background region of interest (ROI), respectively. Since the energy window also has an important role on performance, the CNR was calculated and compared for the following energy windows: 4%, 8%, and 16%. With the availability of the true interaction sequence from GATE simulation output, also computed was the percentage of events with correctly ordered interaction sequences, which provides an indication of how well the method is able to determine the correct sequence.

Reference will now be made to certain results and discussion according to one or more embodiments. In particular, reference will now be made to interaction event type distribution. Table 3 below shows the distribution of events from GATE simulations with the image quality mouse phantom while applying different event trigger low energy thresholds. For the box-shaped system with edge-on CZT crystal configuration, 22.8% of the total number of single 511 keV detected events were photoelectric absorption (with an energy window of 429-592 keV) for a 10 keV threshold. As the energy threshold is increased, MIPEs with energy below the threshold are not detected and appear as a single photoelectric event with energy within the accepted energy window, leading to a higher observed percentage of photoelectric events, 26.5% for 100 keV threshold versus 22.8% for 10 keV threshold. Detection of MIPEs is strongly dependent on the energy threshold, e.g. the percentage of MIPEs dropped from 77.2% for 10 keV threshold to 42.9% for 150 keV threshold. The number of 1 Compton+1 photoelectric interactions increased going from an energy threshold of 10 keV-100 keV. By increasing the energy threshold we are not able to detect interactions below the threshold of the system, therefore events with two Compton interactions and one photoelectric interaction are detected as one Compton and one photoelectric interaction. Depending on which interaction was rejected, this could lead to incorrect mispositioned LOR assignment. If the energy threshold is increased further, the sum of the energy detected is outside of the accepted energy window.

TABLE 3

Distribution (in percentage) of single 511 keV events in a CZT system with different event trigger low energy threshold, $E_{thresh}$, where P = photoelectric, and C = Compton. The same column values increase or decrease with changing threshold due to redistribution and accounting for dropped interactions that fell below the threshold. All percentages are with respect to totals from a 10 keV threshold. Only events whose energy sums to within the energy window (429-592 keV) are considered.

| $E_{thresh}$ (keV) | P | 1C, 1P | 2C, 1P | 3C, 1P | 4C, 1P | 3C, 1P | >6C, 1P |
|---|---|---|---|---|---|---|---|
| 10 | 22.8 | 38.6 | 25.6 | 9.8 | 2.6 | 0.5 | 0.1 |
| 50 | 24.8 | 46.0 | 23.4 | 4.5 | 0.4 | 0.0 | 0.0 |
| 100 | 26.5 | 49.0 | 11.4 | 0.2 | 0 | 0 | 0 |
| 150 | 26.5 | 41.6 | 1.3 | 0 | 0 | 0 | 0 |

Table 4 below shows all the possible MIPEs scenarios (inter- and intra-crystal scatter) for one Compton followed by one photoelectric event (1C,1P) from the results of Table 3 for an energy threshold of 100 keV, which is approximately the same lower energy threshold achieved with a prototype experimental system according to an embodiment (see Abbaszadeh et al 2016). From the total numbers of MIPEs, 53.37% are inter-crystal scatter and 46.73% are intra-crystal scatter. Based on a histogram of the distance between two interactions either within the same 4×4×0.5 cm$^3$ crystal or in two different crystals, the average distance between the MIPEs is approximately 7.7±7.4 mm.

TABLE 4

All the possible MIPEs scenarios (inter- and intra- crystal scatter) for interactions that have 1C, 1P for a per-interaction lower energy threshold of 100 keV.

| MIPEs (1C, 1P) | Percentage (%) |
|---|---|
| 1anode-1cathode | 12.46 |
| 2anode-1cathode | 20.4 |
| 1anode-2cathode | 2.07 |
| 2anode-2cathode | 11.7 |
| Different crystals | 53.37 |

Figure 6A:
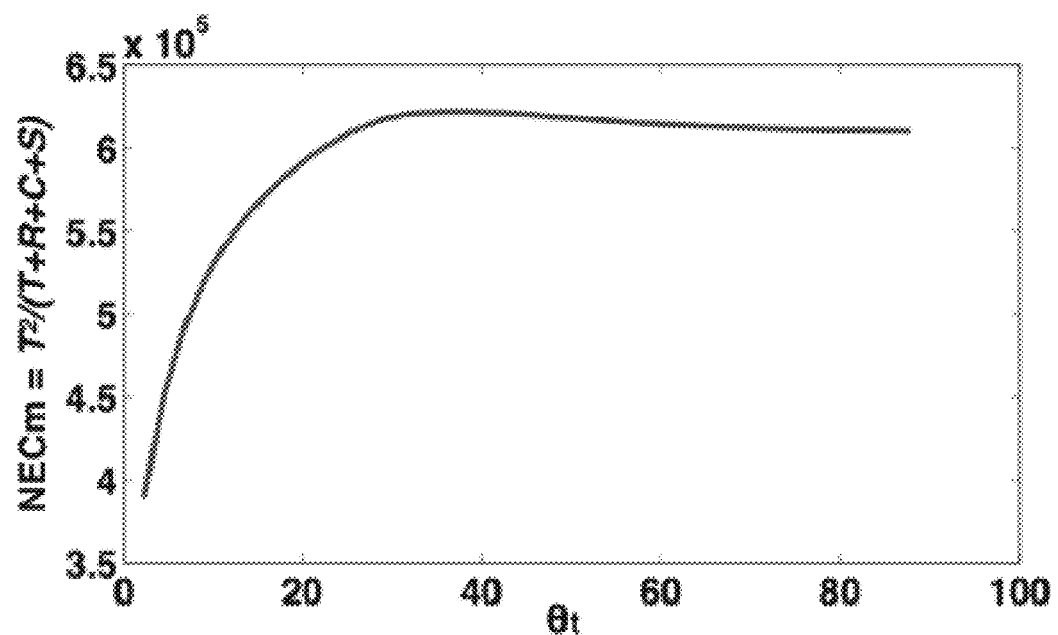
FIGS. 6A and 6B show, according to one or more embodiments, figure of merit versus DDA threshold ($\theta_t$) for 100 keV energy threshold (FIG. 6A) and figure of merit versus DDA threshold for 100 keV lower energy threshold with exact x-y-z positioning and 8% energy blurring (FIG. 6B).
Figure 6B:
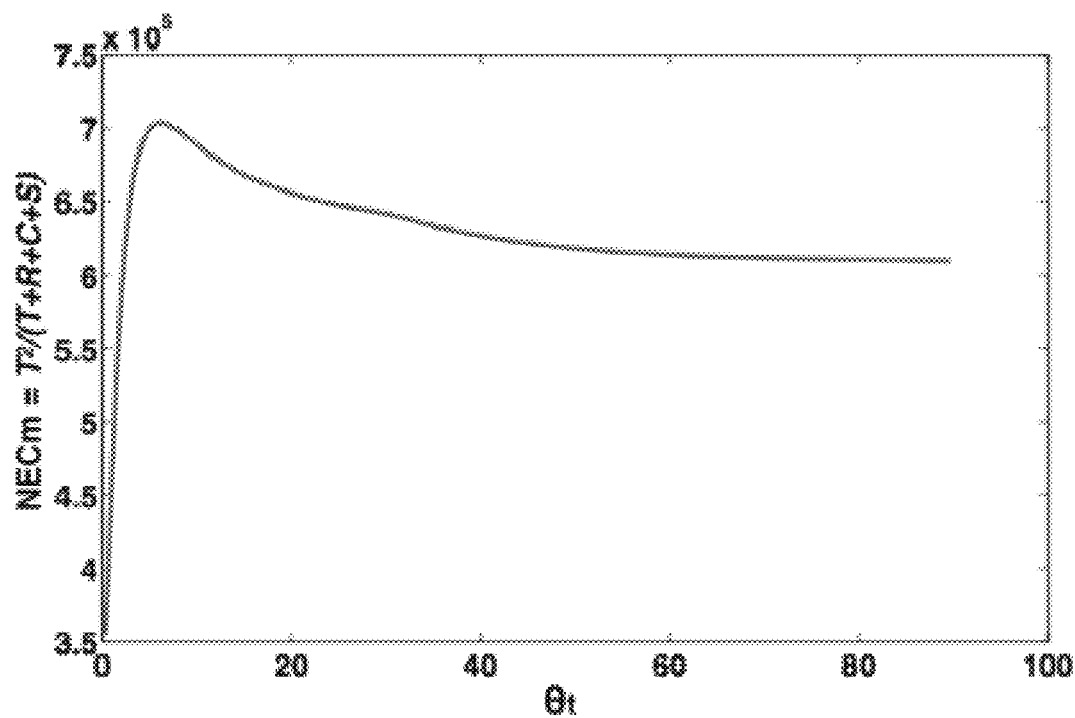
Figure 7:
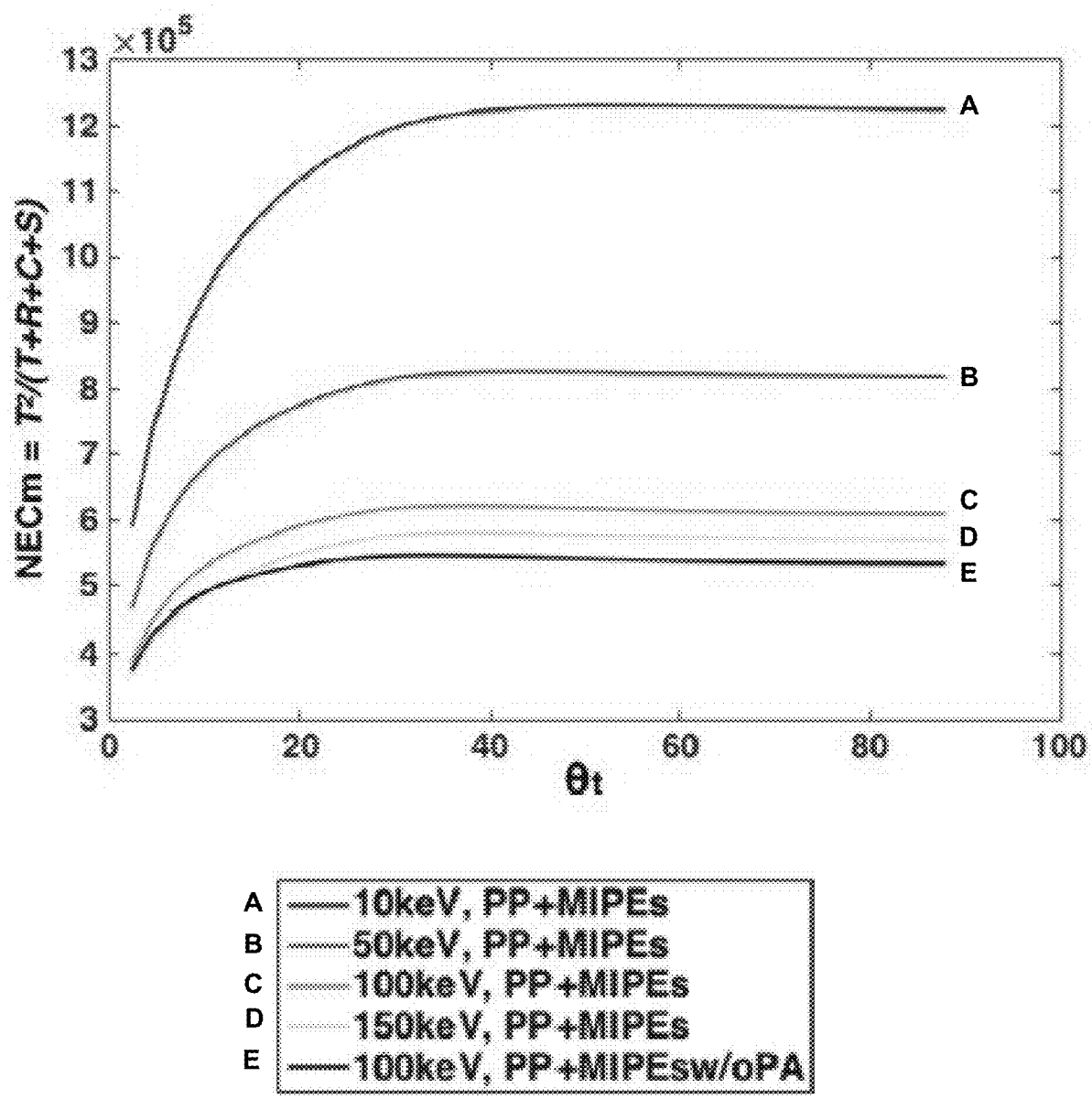
FIG. 7 shows, according to one or more embodiments, figure of merit versus DDA threshold ($\theta_t$) for different energy thresholds.

Still referring to certain results and discussion according to one or more embodiments, reference will now be made to a figure of merit and DDA threshold. FIG. 6A shows the figure of merit (NECm) obtained for different $\theta_t$. As the DDA threshold is increased, the number of accepted trues, randoms, and mispositioned trues changes and leads to an increase or drop in the figure of merit. Note that the spatial resolution of the detector as well as energy blurring impact the sharpness of the peak near the optimal figure of merit. As the position estimate of the first interaction in a MIPE gets more accurate, the error for trues decreases, the optimal $\theta_t$ decreases, and the figure of merit increases (FIG. 6A). Energy blurring has a similar effect but is not able to improve the figure of merit as much as improving the spatial resolution alone. With an energy blurring of 8% and the spatial resolution of the current prototype system (see Abbaszadeh et al 2016), there is limited benefit of choosing an angular difference threshold since the peak is only slightly larger than for the case of accepting all DDA (setting the threshold to 90°). The effect of energy threshold on the figure of merit is shown in FIG. 7. As the energy threshold increases the figure of merit decreases because MIPEs with energy below the energy threshold are not detected, which leads to potential mispositioning of trues.

Figure 9:
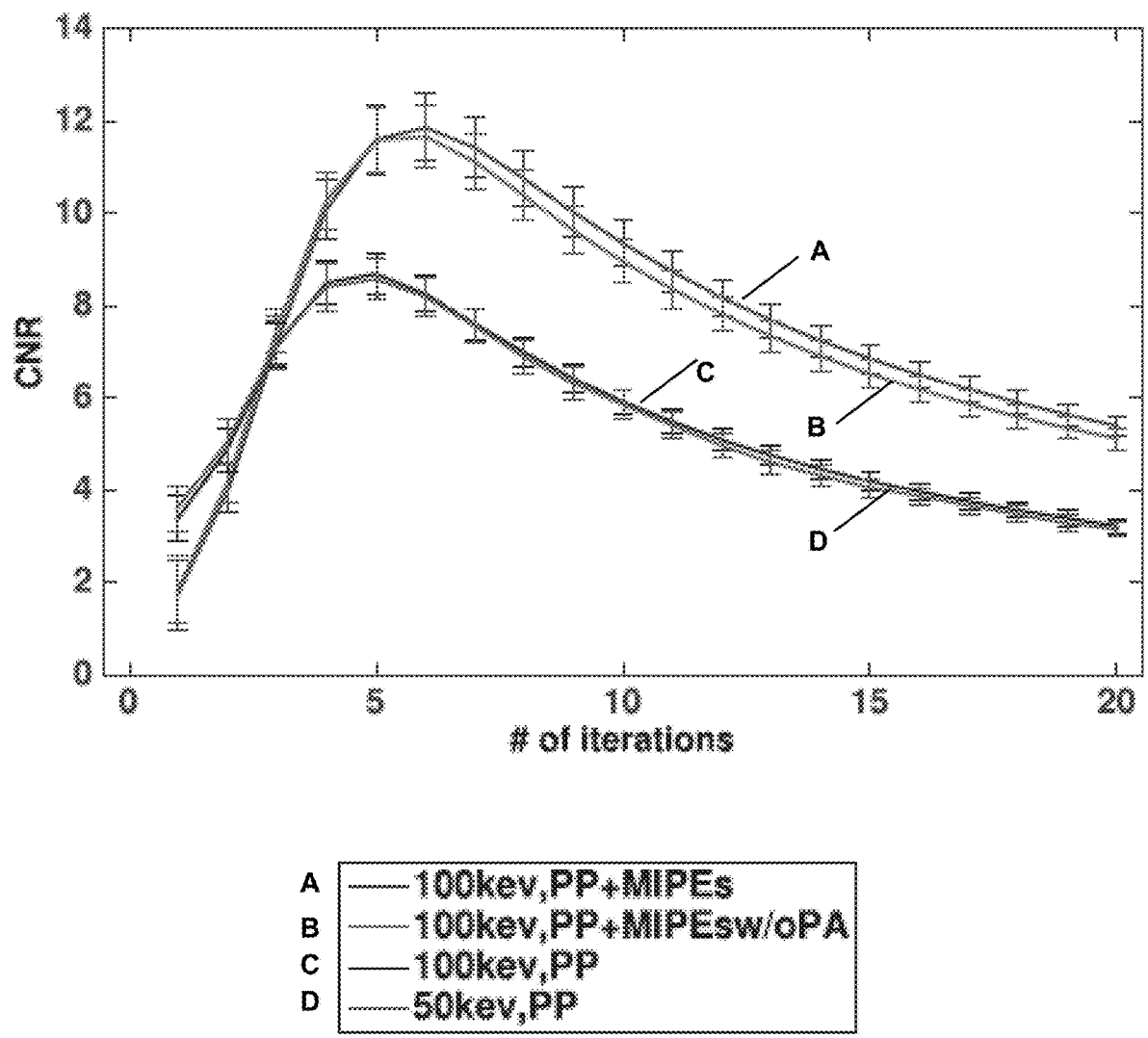
FIG. 9 shows, according to one or more embodiments, CNR as a function of number of iterations in the image reconstruction. The "D" and "C" lines include only the photoelectric events as coincidences (PP). The "B" line also includes the MIPEs without position ambiguity (w/oPA) while the "A" line includes MIPEs with and without position ambiguity.
Figure 10:
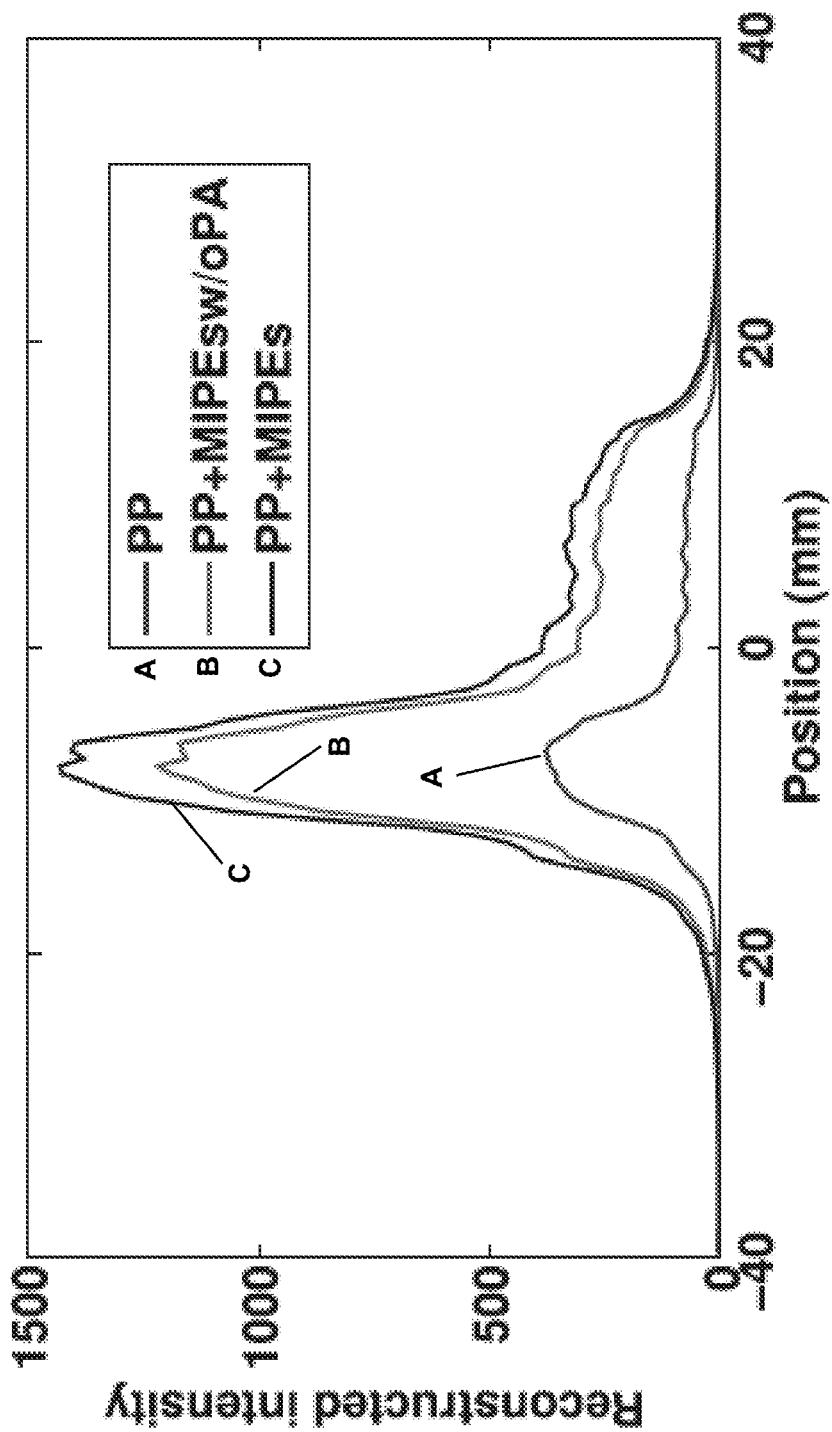
FIG. 10 shows, according to one or more embodiments, line profile for 100 keV lower $E_{thresh}$ for coincidences with photoelectric only (PP), photoelectric plus MIPEs without position ambiguity (PP+MIPEsw/oPA), and photoelectric plus all MIPEs (PP+MIPEs).

Still referring to certain results and discussion according to one or more embodiments, reference will now be made to CNR. FIG. 8 shows an example of the reconstructed phantom and the ROIs used for the hot regions and background. The CNR was calculated using the defined regions of hot (1 region) and background (9 regions). The CNR for the 9 background regions was calculated and the mean and standard deviation from these 9 CNR calculations is reported. FIG. 9 shows the CNR as a function of the iteration number for an energy threshold of 100 keV and coincidences that include just PP events and PP+MIPEs. The maximum CNR for PP was achieved after 4 iterations. However, when including the MIPEs, the maximum CNR was achieved after 6 iterations. Hereafter, for reconstruction the number of iterations that led to the optimal CNR was used. The line profile through the phantom is shown in FIG. 10 considering different types of coincidences. Including the MIPEs with ambiguity increases the total number of accepted events significantly.

Table 5 below shows the CNR and sensitivity for different energy threshold and event types: photoelectric coincidences only (PP), including coincidences with MIPEs. The sensitivity and CNR improves drastically when MIPEs are included for all energy thresholds investigated. There is a slight increase in sensitivity observed with increasing energy threshold, which is a consequence of this analysis, which considers only two-interaction events. As it was shown in Table 3, by increasing the energy threshold from 10-100 keV, a fraction of events with two Compton and one photoelectric interactions are detected as one Compton and one photoelectric interactions. This increases the observed sensitivity, however depending on which interaction was rejected, the CNR can be degraded, as seen in Table 5 below. Thus, to achieve the best performance and assure that MIPEs are positioned correctly a lower energy threshold (down to 10 keV) is desired.

Figure 11A:
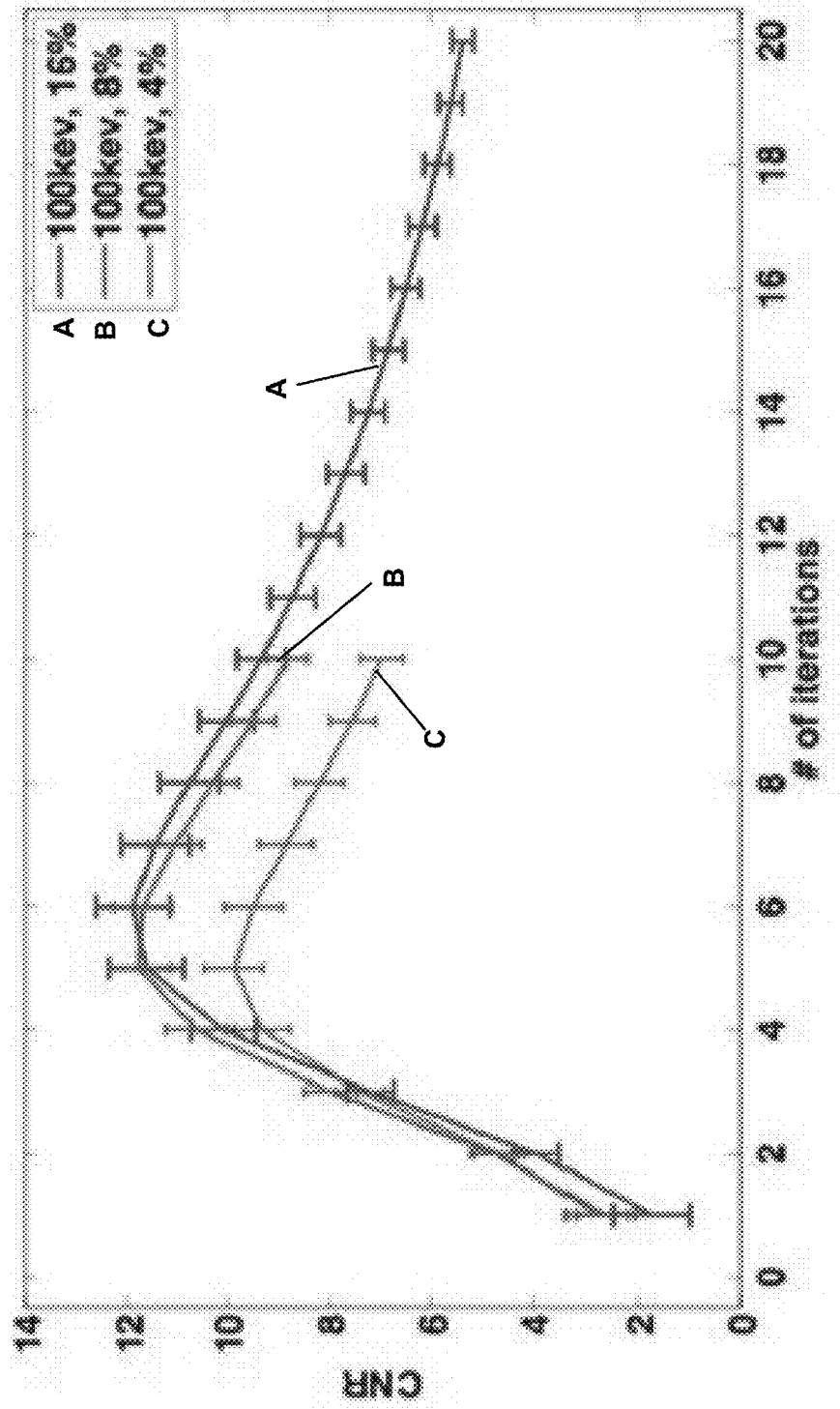
FIGS. 11A and 11B show, according to one or more embodiments, CNR (FIG. 11A) and contrast (FIG. 11B) as a function of number of iterations for different energy acceptance windows centered on the photopeak.
Figure 11B:
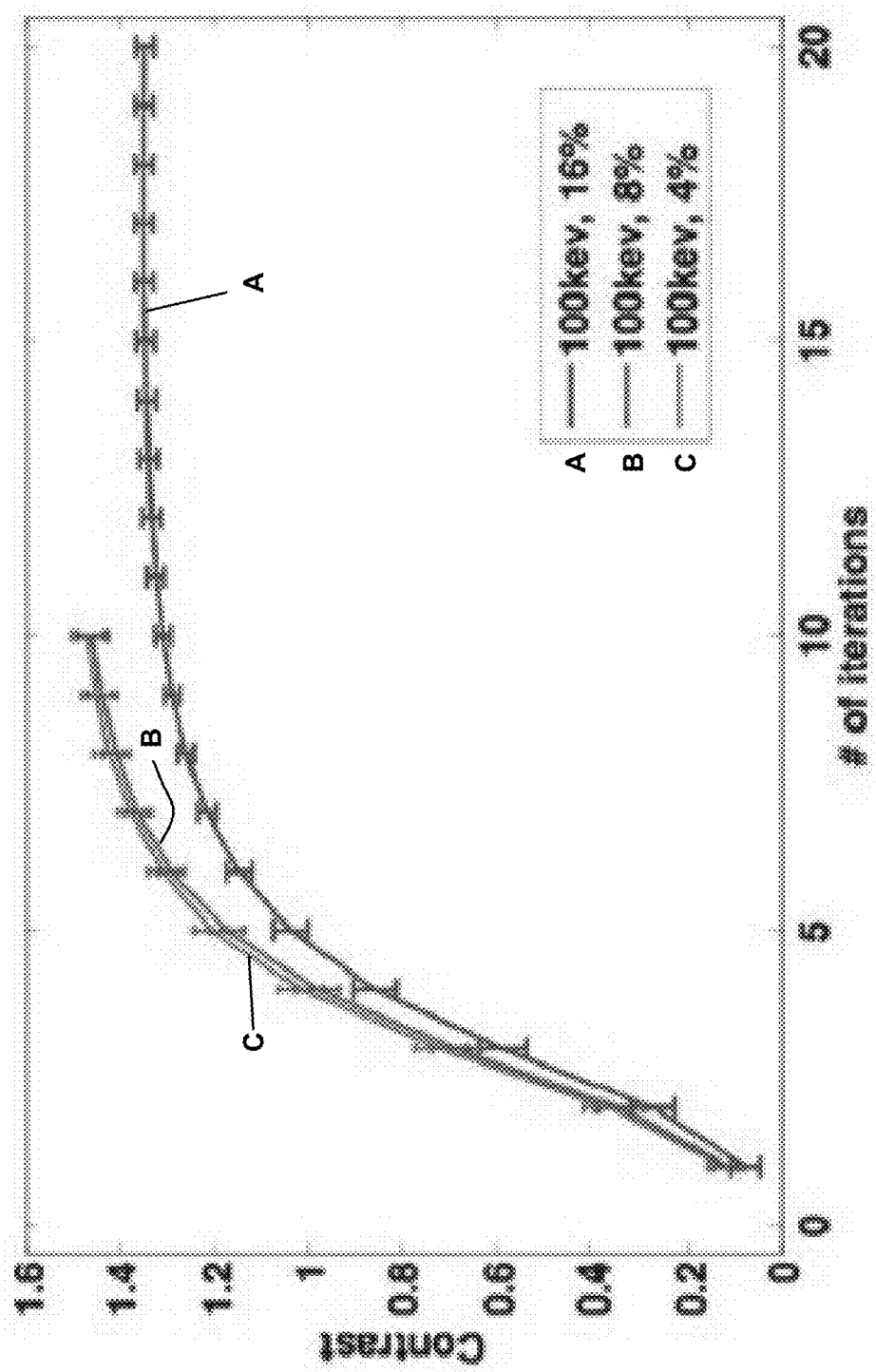

The results of CNR for different energy windows are shown in FIG. 11. Using a small window leads to a significantly reduced amount of accepted events, and the CNR is reduced. Using 8%, which is closest to the energy resolution of the system leads to comparable CNR as 16%, but better contrast, making it the preferred choice.

TABLE 5

Contrast-to-noise ratio (CNR) and sensitivity for different energy thresholds.

| $E_{thresh}$(keV) | Method | CNR | Sensitivity (%) |
|---|---|---|---|
| 10 | PP | 5.81 ± 0.30 | 0.60 |
| 10 | PP + MIPEs | 12.53 ± 0.57 | 4.10 |
| 50 | PP | 5.92 ± 0.30 | 0.66 |
| 50 | PP + MIPEs | 12.05 ± 0.41 | 5.30 |
| 100 | PP | 6.24 ± 0.30 | 0.70 |
| 100 | PP + MIPEs | 11.09 ± 0.40 | 5.88 |

Still referring to certain results and discussion according to one or more embodiments, reference will now be made to comparison of event position accuracy versus energy weighting and random first interaction. The percentage of coincidence events with correctly identified first interactions is shown in Table 6 below for several cases. Note that for the random first interaction method, the results represent the best case, since it is assumed there is no position ambiguity in intra-crystal scatter. For the Compton kinematics method, a lower, low energy threshold per interaction yields a more accurate interaction sequence and the reduction in coincidence timing window (from 20 ns-10 ns) has a minor (less than 1%) effect on performance.

Figure 12A:
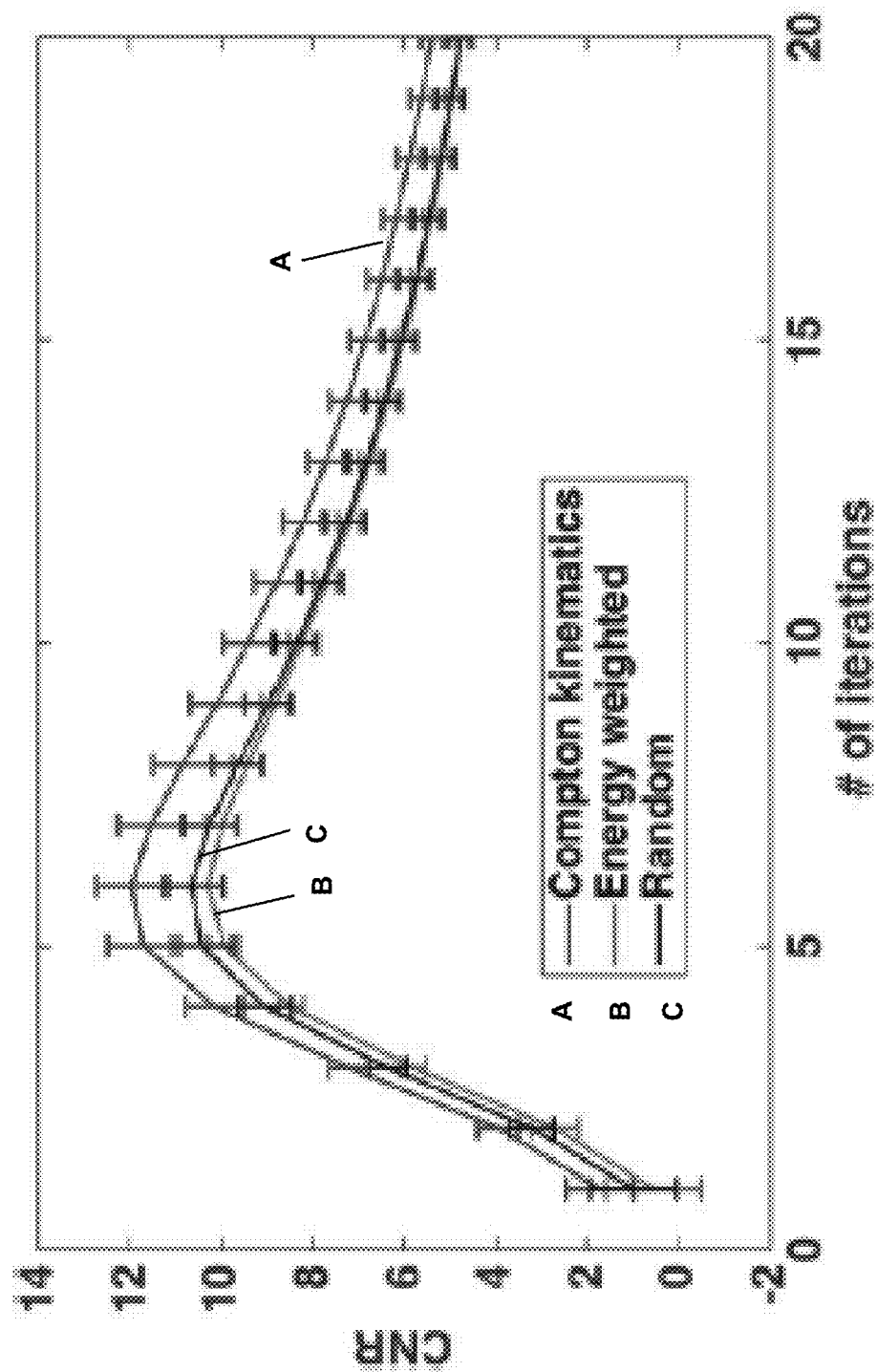
FIGS. 12A and 12B show, according to one or more embodiments, CNR (FIG. 12A) and contrast (FIG. 12B) for the Compton kinematics, energy weighted, and random selection event positioning methods.
Figure 12B:
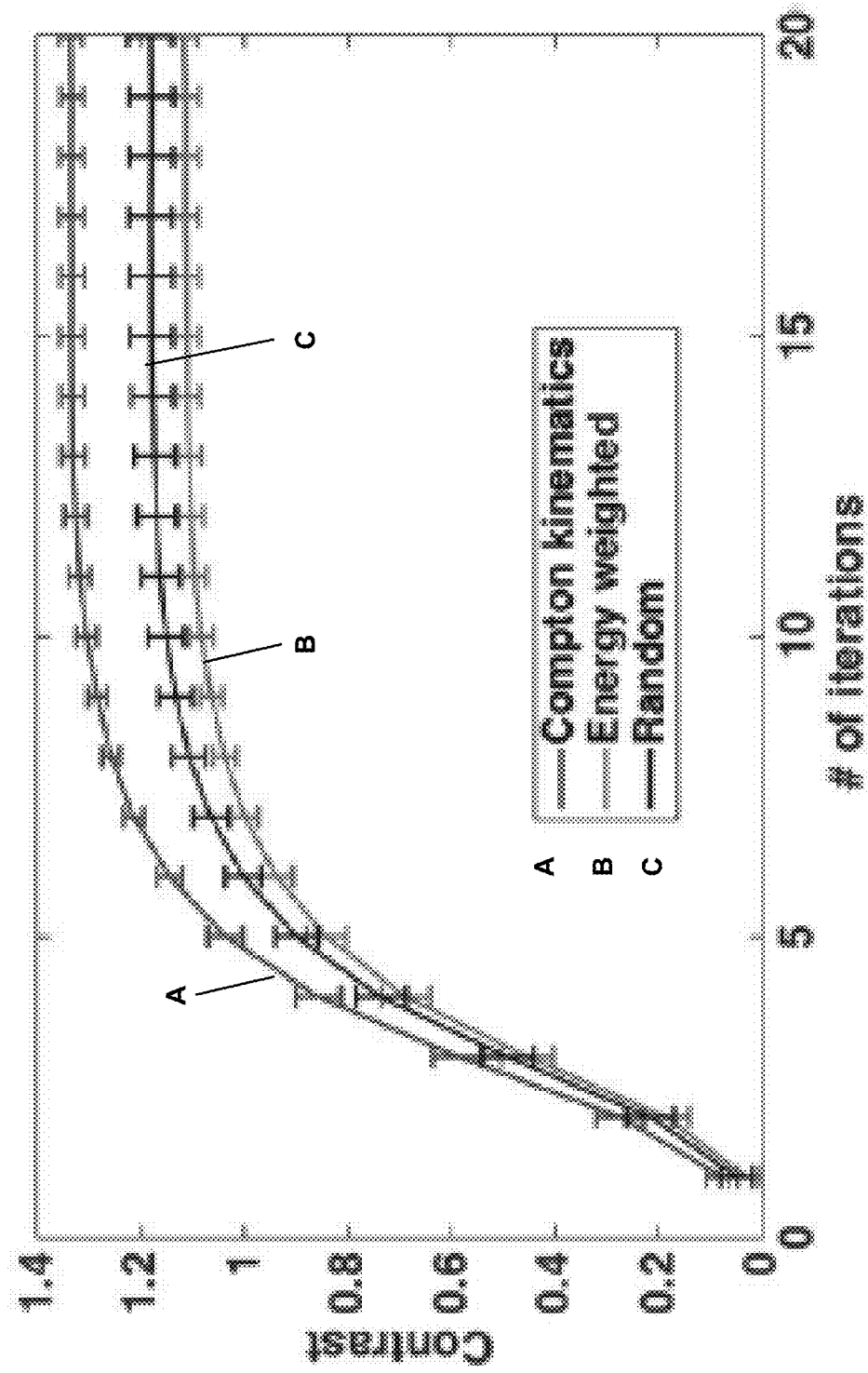
Figure 13A:
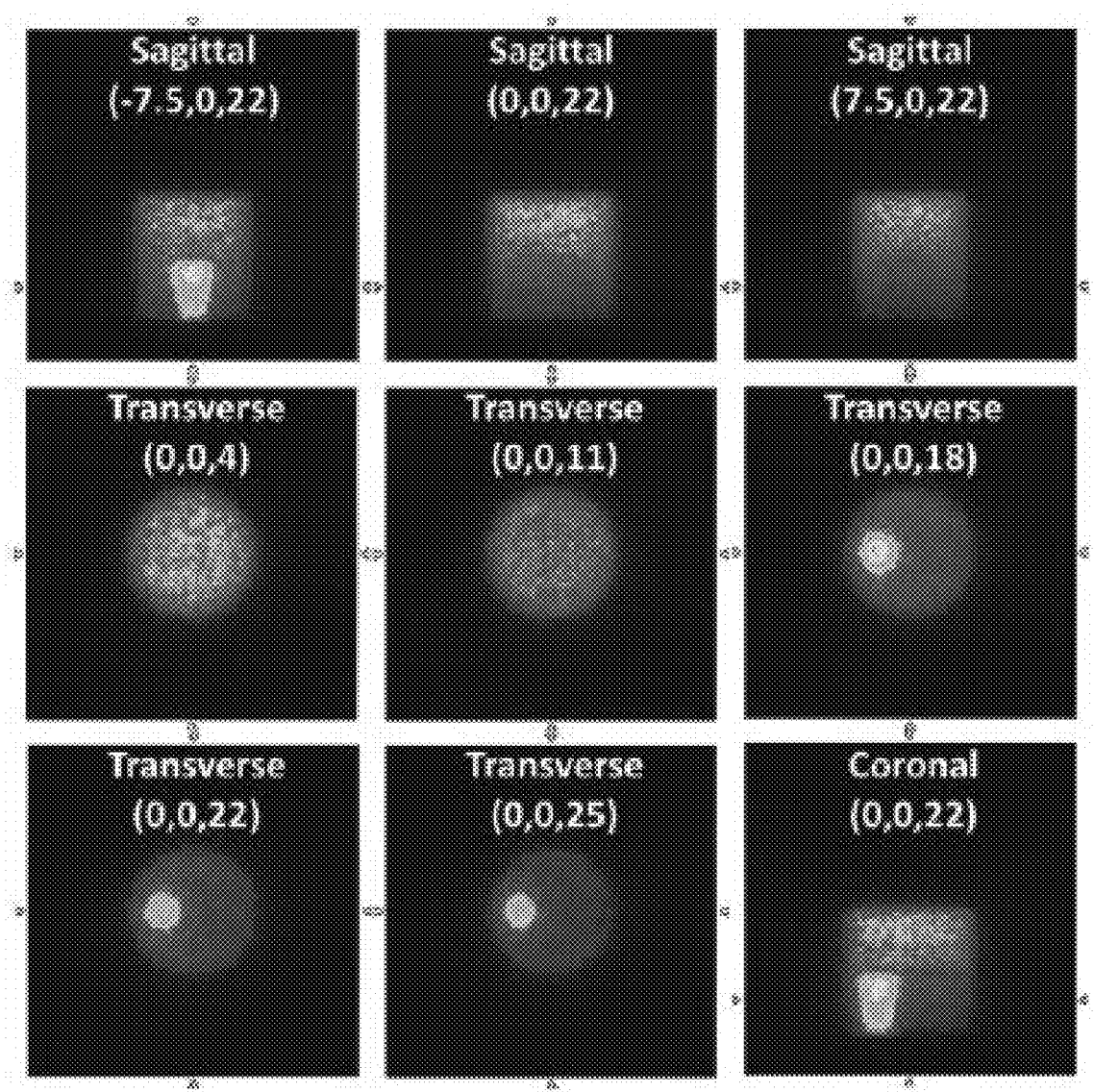
FIGS. 13A-13C show, according to one or more embodiments, transverse, coronal, and sagittal views (9 per method) of the reconstructed images for the Compton kinematics (FIG. 13A), energy weighted (FIG. 13B), and random selection (FIG. 13C) event positioning methods. The centre (x, y, z) coordinates and the views are listed as insets of each reconstructed image.
Figure 13B:
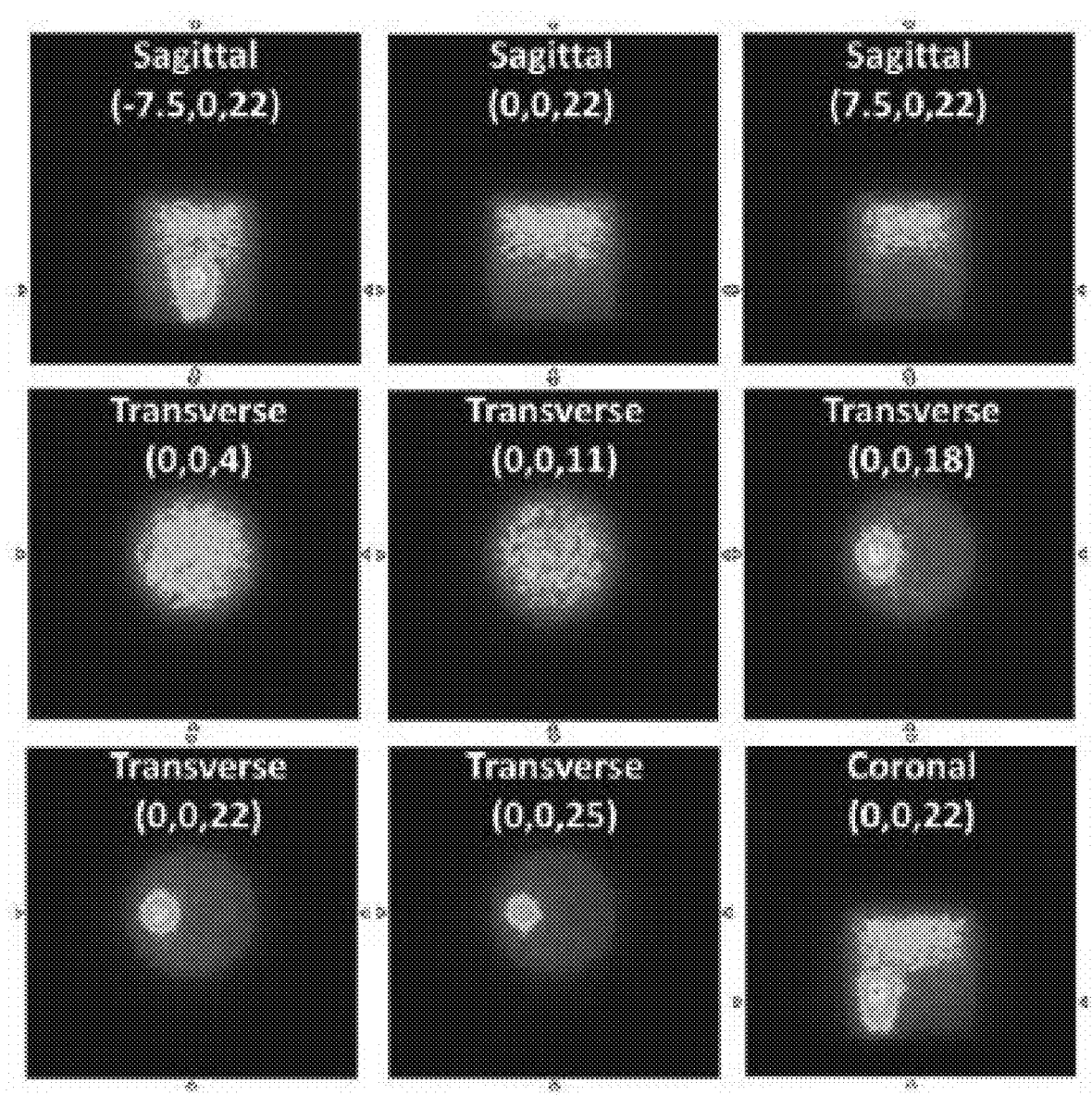
Figure 13C:
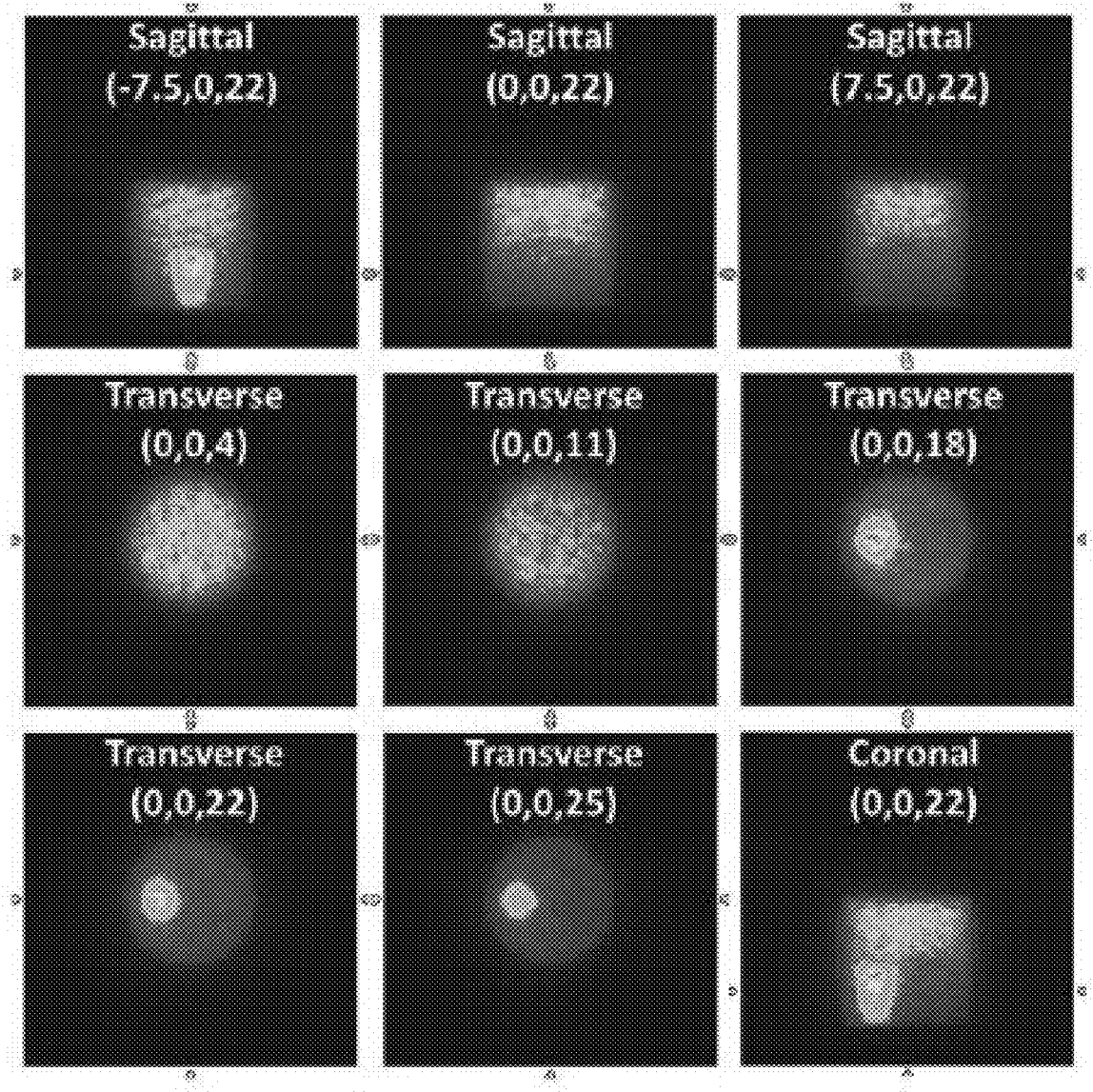

FIG. 12 shows the CNR and contrast for the Compton kinematics, energy-weighted spatial mean positioning, and random selection methods. The Compton kinematics method yields better CNR and contrast. The sensitivity is essentially the same between the methods since they differ in how they position the event LOR. Reconstructed images using either of the methods are shown in FIG. 13.

TABLE 6

Percentages of coincidence events with correctly ordered interactions sequences.

| $E_{thresh}$ (keV) | Coincidence time window (ns) | Method | Phantom | % Correct |
|---|---|---|---|---|
| 10 | 20 | Compton kinematics | NEMA-NU$_4$ | 64.9 |
| 50 | 20 | Compton kinematics | NEMA-NU$_4$ | 60.3 |
| 100 | 20 | Compton kinematics | NEMA-NU$_4$ | 55.9 |
| 100 | 10 | Compton kinematics | NEMA-NU$_4$ | 56.3 |
| 100 | 20 | Random | NEMA-NU$_4$ | 41.2 |
| 10 | 20 | Compton kinematics | Point sources | 65.3 |
| 50 | 20 | Compton kinematics | Point sources | 60.6 |
| 100 | 20 | Compton kinematics | Point sources | 56.3 |
| 100 | 20 | Random | Point sources | 41.0 |

Figure 14A:
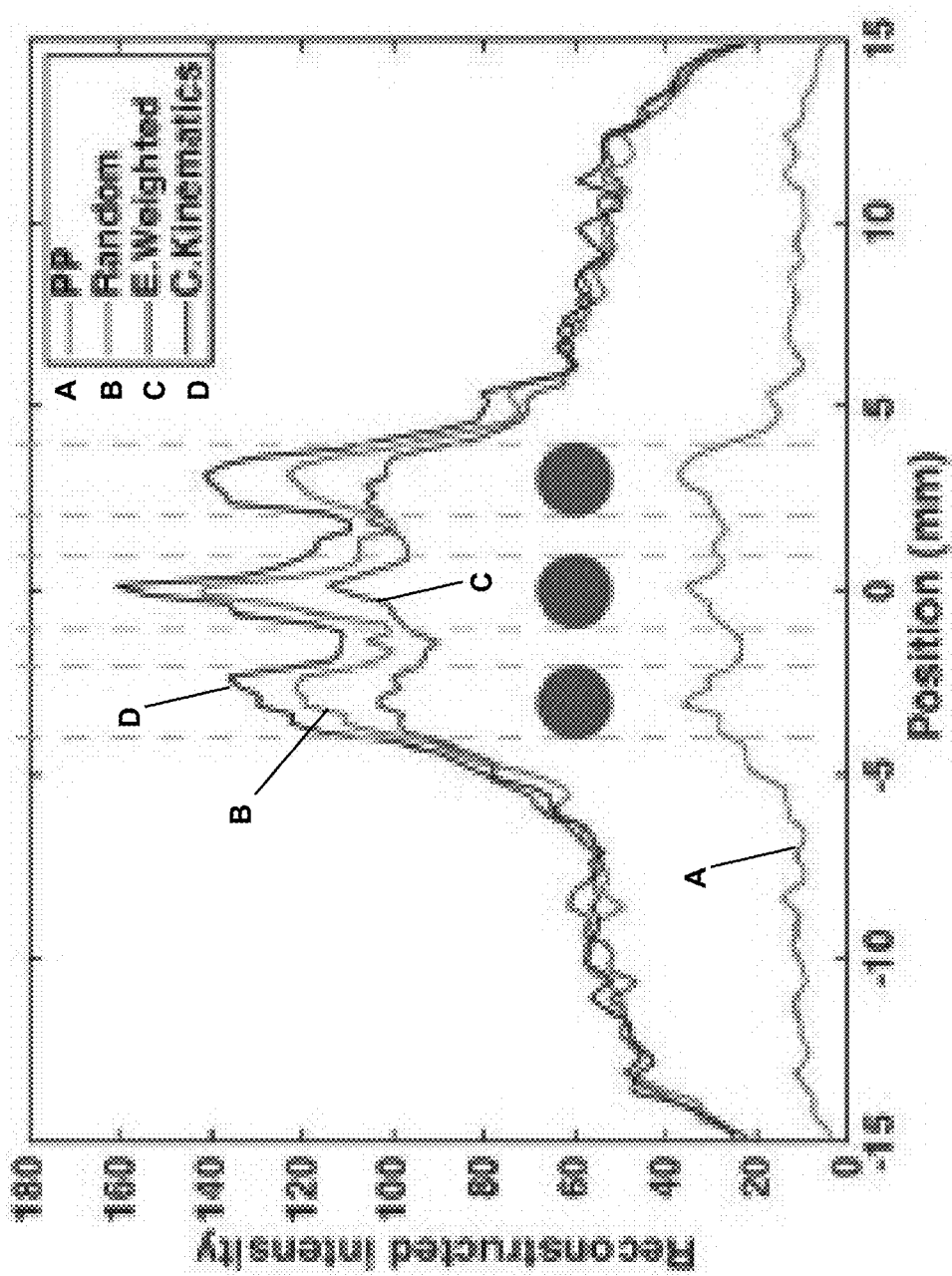
FIGS. 14A-14C show, according to one or more embodiments, line profiles for 2 (FIG. 14A), 1.5 (FIG. 14B), and 1 (FIG. 14C) mm hot spheres. Illustrations of the point source locations are shown (see the shaded circles in this view) at their respective locations.
Figure 14B:
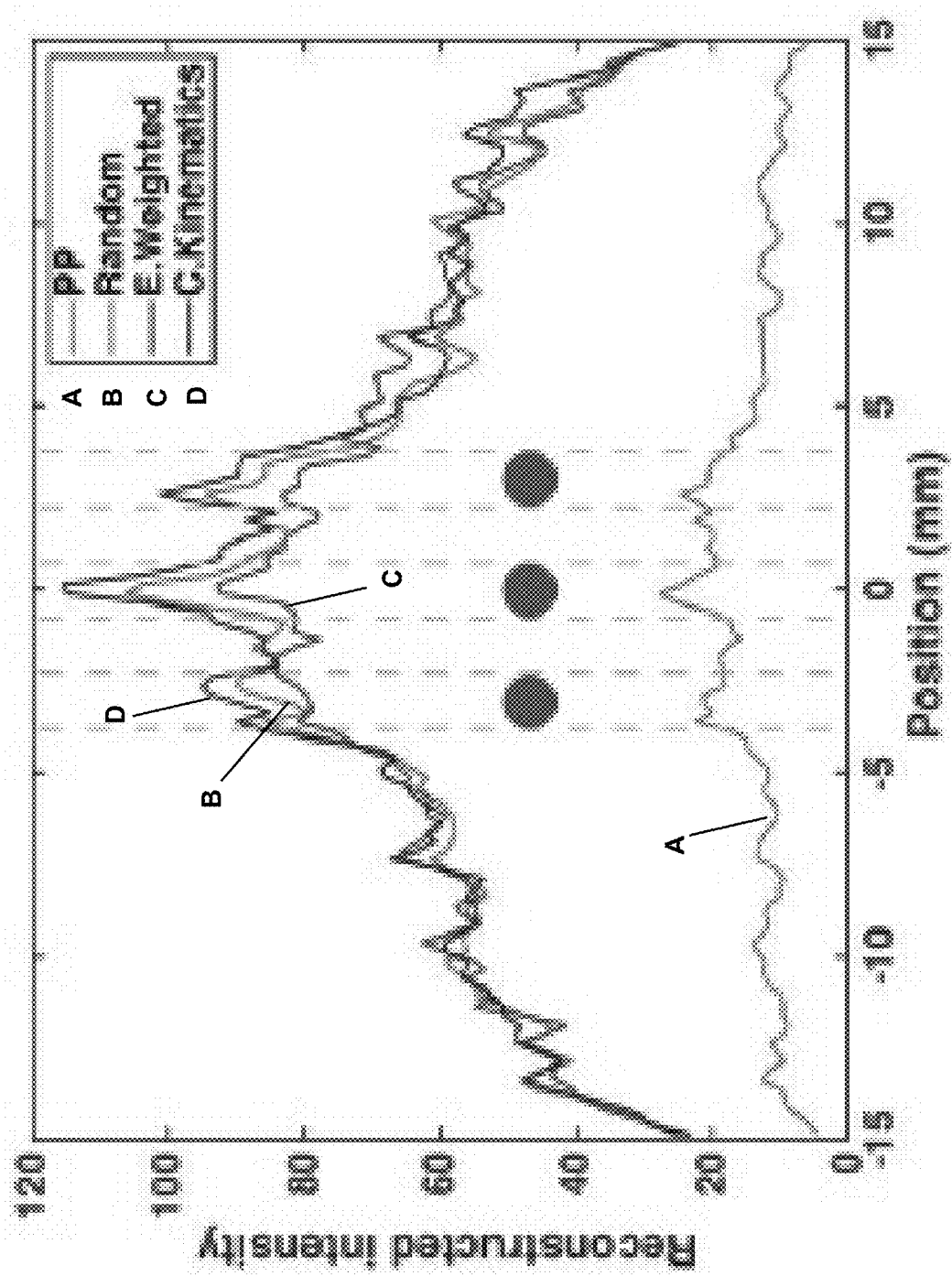
Figure 14C:
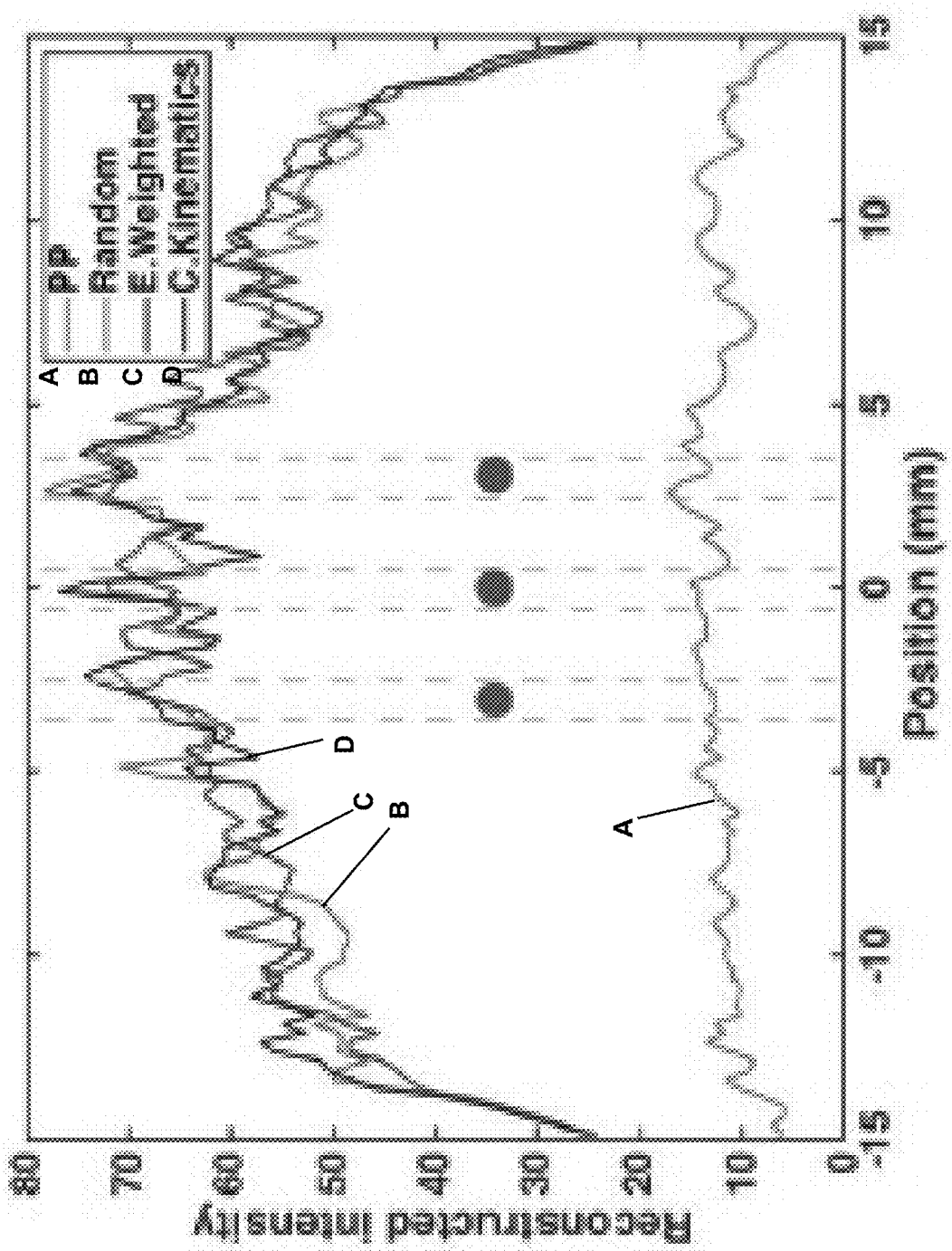

Still referring to certain results and discussion according to one or more embodiments, reference will now be made to spatial resolution using the point source phantom. The point source phantom was simulated for the three interaction event sequencing methods and the case of no MIPEs. A line profile passing through 3 similar size point sources was measured (and averaged across 3 similar line profiles) for comparison of the spatial resolution (FIG. 14). Although the 1 mm sphere is not clearly discernible, the change in intensity for 1.5 and 2 mm spheres is visible for all reconstruction methods. The inclusion of MIPEs using the Compton kinematics method does not appear to significantly degrade the resolution in these cases and the intensity change observed is highest for the Compton kinematics method.

Reference will now be made to certain conclusions according to one or more embodiments. GATE simulation studies of singles in a NEMA NU4 image quality phantom show that 47% of the total numbers of MIPEs are intra-crystal scatter and 53% are inter-crystal scatter in a small animal PET system (according to an embodiment) based on 4×4×0.5 $cm^3$ CZT crystals. Demonstrated is the effect of energy threshold of the system in detecting and positioning multiple interaction events. It was shown that raising the lower energy threshold limits the capability of the system to accurately identify the first interaction position in MIPEs and reduces the CNR. The increase in the sensitivity associated with raising the lower energy threshold per interaction is a consequence of the analysis, which considers only two-indication events. In order to detect MIPEs, a low noise system with low energy threshold (10 keV) per interaction is desired. Compton kinematics and the concept of a 'direction difference angle' was used to find the anode-cathode pair corresponding to first interaction position in intra-crystal scatter as well as inter-crystal scatters. The sensitivity of the system was improved nearly an order of magnitude (7.4 times increase for 100 keV lower energy threshold) including inter- and intra-crystal scatter compared to the case of only considering photoelectric-photoelectric events. With the spatial resolution and energy resolution of a system according to one or more embodiments, choosing a DDA threshold was not imperative, since the peak value of the figure of merit, NECm, (at the optimal threshold) was only marginally above the value when no threshold was chosen. A comparison of event positioning accuracy versus the energy-weighted spatial means and random selection methods showed that using Compton kinematics yields better performance in terms of CNR, contrast, percentage of correctly ordered interaction sequences, and spatial resolution.

As described herein, one or more embodiments use Compton kinematics and a "direction difference angle" to provide a method (and associated system) to correctly identify the anode-cathode pair corresponding to the first interaction position in an intra-crystal scatter event. GATE simulation studies of a NEMA NU4 image quality phantom in a small animal positron emission tomography composed of 192, 40 mm×40 mm×5 mm CZT crystals (according to one or more embodiments) shows that 47% of total numbers of multiple-interaction photon events (MIPEs) are intra-crystal scatter with a 100 keV lower energy threshold per interaction. In one or more embodiments the sensitivity of the system increases (relative to certain conventional mechanisms) from 0.6 to 4.10 (using 10 keV as system lower energy threshold) by including rather than discarding inter- and intra-crystal scatter. The contrast-to-noise ratio (CNR) also increases from 5.81±0.3 to 12.53±0.37. It was shown that a higher energy threshold limits the capability of the system to detect MIPEs and reduces CNR. Results indicate a sensitivity increase (4.1 to 5.88) when raising the lower energy threshold (10 keV to 100 keV) for the case of only two-interaction events. In order to detect MIPEs accurately, a low noise system capable of a low energy threshold (10 keV) per interaction is desired.

As described herein, one or more embodiments use the physics of positron annihilation tomography and Compton kinematics to pair the anodes and cathodes in multiple interaction events.

Referring now to FIG. 15, various steps of a method 1500 according to an embodiment are shown. As seen in this FIG. 15, step 1502 comprises measuring in a first semiconductor crystal of a plurality of semiconductor crystals two anode channels and two cathode channels and measuring in a second semiconductor crystal of the plurality of semiconductor crystals one anode channel and one cathode channel. Next, step 1504 comprises determining whether an energy of a sum of the two anode channels of the first semiconductor crystal is within an energy window Next, step 1506 comprises determining whether an energy of the one anode channel of the second semiconductor crystal is within the energy window. Next, step 1508 comprises responsive to the energy of the sum of the two anode channels of the first semiconductor crystal being within the energy window and the energy of the one anode channel of the second semiconductor crystal being within the energy window: separating the two anode channels and the two cathode channels of the first semiconductor crystal into combinations of anode-cathode channel pairs; for each of the anode-cathode channel pairs of the first semiconductor crystal, determining a respective direction difference angle, each respective direction difference angle being determined via use of the one anode channel and one cathode channel of the second semiconductor crystal; determining from among the direction difference angles a determined one of the direction difference angles that has a smallest value; and setting as an initial interaction position of a photon a selected one of the anode-cathode channel pairs that corresponds to the determined direction difference angle that has the smallest value.

While for purposes of simplicity of explanation, the respective processes are shown and described as a series of blocks in FIG. 15, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Referring now to FIG. 16, various steps of a method 1600 according to an embodiment are shown. As seen in this FIG. 16, step 1602 comprises measuring in a first one of the semiconductor crystals one or more anode channels and one or more cathode channels and measuring in a second one of the semiconductor crystals one or more anode channels and one or more cathode channels. Next, step 1604 comprises determining whether an energy of a sum of the one or more anode channels of the first semiconductor crystal is within an energy window. Next, step 1606 comprises determining whether an energy of a sum of the one or more anode channels of the second semiconductor crystal is within the energy window. Next, step 1608 comprises responsive to the energy of the sum of the one or more anode channels of the first semiconductor crystal being within the energy window and the energy of the sum of the one or more anode channels of the second semiconductor crystal being within the energy window: separating the one or more anode channels and the one or more cathode channels of the first semiconductor crystal into first combinations of anode-cathode channel pairs; separating the one or more anode channels and the one or more cathode channels of the second semiconductor crystal into second combinations of anode-cathode channel pairs; creating a plurality of sequences of interaction points from the first combinations of anode-cathode channel pairs of the first semiconductor crystal; creating a plurality of sequences of interaction points from the second combinations of anode-cathode channel pairs of the second semiconductor crystal; for each of the plurality of sequences in the first semiconductor crystal, determining a respective direction difference angle via use of each of the plurality of sequences of the second semiconductor crystal; determining from among the direction difference angles a determined one of the direction difference angles that has a smallest value; and setting, as initial interaction positions of photons, selected ones of the anode-cathode channel pairs that correspond to a sequence that has the determined direction difference angle that has the smallest value.

While for purposes of simplicity of explanation, the respective processes are shown and described as a series of blocks in FIG. 16, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Referring now to FIG. 17, various steps of a method 1700 according to an embodiment are shown. As seen in this FIG. 17, step 1702 comprises measuring in a first crystal two or more channels and measuring in a second crystal one or more channels. Next, step 1704 comprises determining whether an energy of a sum of the two or more channels of the first crystal is within an energy window. Next, step 1706 comprises determining whether an energy of a sum of the one or more channels of the second crystal is within the energy window. Next, step 1708 comprises responsive to the energy of the sum of the two or more channels of the first crystal being within the energy window and the energy of the sum of the one or more channels of the second crystal being within the energy window: creating a plurality of sequences of interaction points from the two or more channels of the first crystal; creating one or more sequences of interaction points from the one or more channels of the second crystal; for each of the plurality of sequences in the first crystal, determining a respective direction difference angle via use of each of the one or more sequences of the second crystal; determining from among the direction difference angles a determined one of the direction difference angles that has a smallest value; and setting, as initial interaction positions of photons, selected ones of the channels that correspond to a sequence that has the smallest direction difference angle.

While for purposes of simplicity of explanation, the respective processes are shown and described as a series of blocks in FIG. 17, it is to be understood and appreciated that the claimed subject matter is not limited by the order of the blocks, as some blocks may occur in different orders and/or concurrently with other blocks from what is depicted and described herein. Moreover, not all illustrated blocks may be required to implement the methods described herein.

Figure 18:
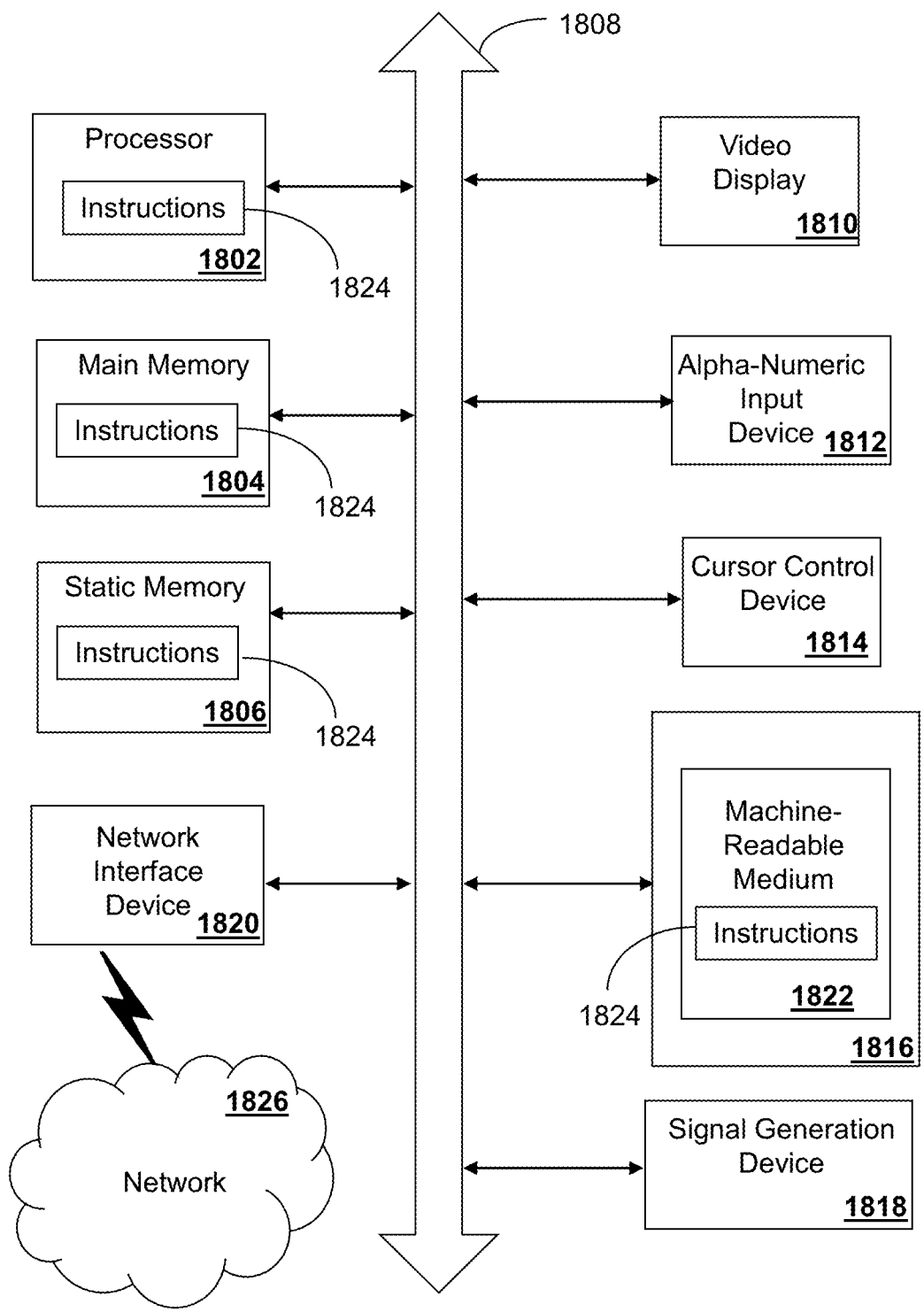
FIG. 18 is a block diagram illustrating an example, non-limiting embodiment of a system in accordance with various aspects described herein.

Referring now to FIG. 18, this depicts an example diagrammatic representation of a machine in the form of a computer system 1800 within which a set of instructions, when executed, may cause the machine to perform any one or more of the methods discussed herein. In some embodiments, the machine may be connected (e.g., using a network) to other machines. In a networked deployment, the machine may operate in the capacity of a server or a client user machine in a server-client user network environment, or as a peer machine in a peer-to-peer (or distributed) network environment.

The machine may comprise a server computer, a client user computer, a personal computer (PC), a tablet PC, a smart phone, a laptop computer, a desktop computer, a control system, a network router, switch or bridge, or any machine capable of executing a set of instructions (sequential or otherwise) that specify actions to be taken by that machine. It will be understood that a communication device of the subject disclosure includes broadly any electronic device that provides voice, video or data communication. Further, while a single machine is illustrated, the term "machine" shall also be taken to include any collection of machines that individually or jointly execute a set (or multiple sets) of instructions to perform any one or more of the methods discussed herein.

The computer system 1800 may include a processor 1802 (e.g., a controller, a central processing unit (CPU), a graphics processing unit (GPU, or any combination thereof), a main memory 1804 and a static memory 1806, which communicate with each other via a bus 1808. The computer system 1800 may further include a video display unit 1810 (e.g., a liquid crystal display (LCD), a flat panel, or a solid state display). The computer system 1800 may include an input device 1812 (e.g., a keyboard), a cursor control device 1814 (e.g., a mouse), a disk drive unit 1816, a signal generation device 1818 (e.g., a speaker or remote control) and a network interface device 1820.

The disk drive unit 1816 may include a tangible computer-readable storage medium 1822 on which is stored one or more sets of instructions (e.g., software 1824) embodying any one or more of the methods or functions described herein, including those methods illustrated above. The instructions 1824 may also reside, completely or at least partially, within the main memory 1804, the static memory 1806, and/or within the processor 1802 during execution thereof by the computer system 1800. The main memory 1804 and the processor 1802 also may constitute tangible computer-readable storage media.

Dedicated hardware implementations including, but not limited to, application specific integrated circuits, programmable logic arrays and other hardware devices can likewise be constructed to implement the methods described herein. Applications that may include the apparatus and systems of various embodiments broadly include a variety of electronic and computer systems. Some embodiments implement functions in two or more specific interconnected hardware modules or devices with related control and data signals communicated between and through the modules, or as portions of an application-specific integrated circuit. Thus, the example system is applicable to software, firmware, and hardware implementations.

In accordance with various embodiments of the subject disclosure, the operations and/or methods described herein are intended for operation as software programs running or executed by or on a computer processor or other computing device, and which may include other forms of instructions manifested as a state machine implemented with logic components in an application specific integrated circuit or field programmable gate array. Furthermore, software implementations (e.g., software programs, instructions, etc.) including, but not limited to, distributed processing or component/object distributed processing, parallel processing, or virtual machine processing can also be constructed to implement the methods and/or operations described herein.

It is further noted that a computing device such as a processor, a controller, a state machine or other suitable device for executing instructions to perform operations and/or methods may perform such operations and/or methods directly or indirectly by way of one or more intermediate devices directed by the computing device.

While the tangible computer-readable storage medium 1822 is shown in an example embodiment to be a single medium, the term "tangible computer-readable storage medium" should be taken to include a single medium or multiple media (e.g., a centralized or distributed database, and/or associated caches and servers) that store the one or more sets of instructions. The term "tangible computer-readable storage medium" shall also be taken to include any non-transitory medium that is capable of storing or encoding a set of instructions for execution by the machine and that cause the machine to perform any one or more of the methods and/or operations of the subject disclosure. The term "non-transitory" as in a non-transitory computer-readable storage medium includes without limitation memories, drives, devices and anything tangible but not a signal per se.

The term "tangible computer-readable storage medium" shall accordingly be taken to include, but not be limited to: solid-state memories such as a memory card or other package that houses one or more read-only (non-volatile) memories, random access memories, or other re-writable (volatile) memories, a magneto-optical or optical medium such as a disk or tape, or other tangible media which can be used to store information. Accordingly, the disclosure is considered to include any one or more of a tangible computer-readable storage medium, as listed herein and including art-recognized equivalents and successor media, in which the software implementations herein are stored.

Although the present specification describes components and functions implemented in the embodiments with reference to particular standards and protocols, the disclosure is not limited to such standards and protocols. Each of the standards for Internet and other packet switched network transmission (e.g., TCP/IP, UDP/IP, HTML, HTTP) represent examples of the state of the art. Such standards are from time-to-time superseded by faster or more efficient equivalents having essentially the same functions. Wireless standards for device detection (e.g., RFID), short-range communications (e.g., Bluetooth, WiFi, Zigbee), and long-range communications (e.g., WiMAX, GSM, CDMA) are contemplated for use by computer system 1800.

In distributed environments, the embodiments described in the subject disclosure can be adapted to utilize multiple display units controlled by two or more computer systems. In this configuration, presentations described by the subject disclosure can in part be shown in a first of the display units, while the remaining portion is presented in a second of the display units.

Application specific integrated circuit(s) and/or programmable logic array(s) can use downloadable instructions for executing state machines and/or circuit configurations to implement embodiments of the subject disclosure.

From the foregoing descriptions, it would be evident to an artisan with ordinary skill in the art that the aforementioned embodiments can be modified, reduced, or enhanced without departing from the scope and spirit of the claims described below. For example, any desired number of panels, cameras and/or micro-camera-elements can be utilized. Other suitable modifications can be applied to the subject disclosure. Accordingly, the reader is directed to the claims for a fuller understanding of the breadth and scope of the subject disclosure.

The illustrations of embodiments described herein are intended to provide a general understanding of the structure of various embodiments, and they are not intended to serve as a complete description of all the elements and features of apparatus and systems that might make use of the structures described herein. Many other embodiments will be apparent to those of skill in the art upon reviewing the above description. Other embodiments may be utilized and derived therefrom, such that structural and logical substitutions and changes may be made without departing from the scope of this disclosure. Figures are also merely representational and may not be drawn to scale. Certain proportions thereof may be exaggerated, while others may be minimized. Accordingly, the specification and drawings are to be regarded in an illustrative rather than a restrictive sense.

Below is a list of tables found herein:

Table 1—All the possible anode-cathode pair for identifying the first interaction location in FIG. 1.

Table 2—CZT-based small animal initial system characterization. Note that the spatial resolution includes the charge sharing effect.

Table 3—Distribution (in percentage) of single 511 keV events in a CZT system with different event trigger low energy threshold, $E_{thresh}$, where P=photoelectric, and C=Compton. The same column values increase or decrease with changing threshold due to redistribution and accounting for dropped interactions that fell below the threshold. All percentages are with respect to totals from a 10 keV threshold. Only events whose energy sums to within the energy window (429-592 keV) are considered.

Table 4—All the possible MIPEs scenarios (inter- and intra-crystal scatter) for interactions that have 1C, 1P for a per-interaction lower energy threshold of 100 keV.

Table 5—Contrast-to-noise ratio (CNR) and sensitivity for different energy thresholds.

Table 6—Percentage of coincidence events with correctly ordered interaction sequences.

Below are citations for a number of references mentioned herein:

Abbaszadeh S and Levin C S 2017 New-generation small animal positron emission tomography system for molecular imaging *J. Med. Imaging* 4 011008

Abbaszadeh S, Gu Y, Reynolds P D and Levin C S 2016 Characterization of a sub-assembly of 3D position sensitive cadmium zinc telluride detectors and electronics from a sub-millimeter resolution PET system *Phys. Med. Biol.* 61 6733

Abbaszadeh S, Gu Y, Sikora U and Levin C S 2014 First acquisition of data from a prototype 3D position sensitive CZT PET system *IEEE Nuclear Science Symp. and Medical Imaging Conf.* pp 1-2

Bindseil G 2013 Approaches toward combining positron emission tomography with magnetic resonance imaging *PhD Thesis* University of Western Ontario Champley K M, Lewellen T K, MacDonald L R, Miyaoka R S and Kinahan P E 2009 Statistical LOR estimation for a high-resolution dMiCE PET detector *Phys. Med. Biol.* 54 6369

Cherry S R, Sorenson J A and Phelps M E 2012 *Physics in Nuclear Medicine (Positron Emission Tomography)* 4th edn (New York: Elsevier) ch 18

Chinn G and Levin C S 2011 A maximum NEC criterion for compton collimation to accurately identify true coincidences in PET *IEEE Trans. Med. Imaging* 30 1341-52

Comanor K A, Virador P R G and Moses W W 1996 Algorithms to identify detector compton scatter in PET modules *IEEE Trans. Nucl. Sci.* 43 2213-8

Cui J Y, Pratx G, Prevrhal S and Levin C S 2011 Fully 3D list-mode time-of-flight PET image reconstruction on GPUs using CUDA *Med. Phys.* 38 6775-86

Gu Y and Levin C 2014 Study of electrode pattern design for a CZT-based PET detector *Phys. Med. Biol.* 59 2599

Gu Y and Levin C S 2011 Studies of electrode design for a sub-mm resolution 3D position sensitive CZT PET detector *IEEE Nuclear Science Symp. Conf. Record pp* 2303-5

Gu Y and Levin C S 2012 Characterization of inter-detector effects in a 3D position-sensitive dual-CZT detector modules for PET *IEEE Nuclear Science Symp. and Medical Imaging Conf.* (IEEE) pp 4088-90

Gu Y, Matteson J, Skelton R, Deal A, Stephan E, Duttweiler F, Gasaway T and Levin C 2011 Study of a high-resolution, 3D positioning cadmium zinc telluride detector for PET *Phys. Med. Biol.* 56 1563

Jan S et al 2004 GATE: a simulation toolkit for PET and SPECT *Phys. Med. Biol.* 49 4543

Kalemci E and Matteson J 2002 Investigation of charge sharing among electrode strips for a CdZnTe detector *Nucl. Instrum. Methods Phys. Res. Sect. A* 478 527-37

Kalemci E, Matteson J L, Skelton R T, Hink P L and Slavis K R 1999 Model calculations of the response of CZT strip detectors SPIE's *Int. Symp. on Optical Science, Engineering and Instrumentation* (International Society for Optics and Photonics) pp 360-73

Kim J C, Kaye W R, Yang H, Brown C R and He Z 2013 Improvement of sub-pixel position sensing in nonuniform large-volume pixelated CdZnTe crystals *IEEE Trans. Nucl. Sci.* 60 1201-7

Lee K, Martin J, Garson A III, Beilicke M, Guo Q, Li Q, De Geronimo G, Groza M, Burger A and Krawczynski H 2010 Development of x-ray and gamma-ray CZT detectors for homeland security applications *SPIE Defense, Security, and Sensing* (International Society for Optics and Photonics) p 766423

Matteson J L, Gu Y, Skelton R T, Deal A C, Stephan E A, Duttweiler F, Huszar G L, Gasaway T M and Levin C S 2008 Charge collection studies of a high resolution CZT-based detector for PET IEEE *Nuclear Science Symp. Conf. Record* (IEEE) pp 503-10

Pratx G and Levin C S 2009 Bayesian reconstruction of photon interaction sequences for high-resolution PET detectors *Phys. Med. Biol.* 54 5073

Yoon C, Lee W and Lee T 2011 Simulation for CZT compton PET (Maximization of the efficiency for PET using Compton event) *Nucl. Instrum. Methods Phys. Res. Sect. A* 652 713-6

Although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A system, comprising:
    a plurality of semiconductor crystals, each of the semiconductor crystals having a respective cross-strip electrical pattern with a plurality of anode channels and a plurality of cathode channels;
    a processing system including a processor; and
    a memory that stores executable instructions that, when executed by the processing system, facilitate performance of operations, the operations comprising:
        measuring in a first semiconductor crystal of the plurality of semiconductor crystals two anode channels and two cathode channels and measuring in a second semiconductor crystal of the plurality of semiconductor crystals one anode channel and one cathode channel;
        determining whether an energy of a sum of the two anode channels of the first semiconductor crystal is within an energy window;
        determining whether an energy of the one anode channel of the second semiconductor crystal is within the energy window;
        responsive to the energy of the sum of the two anode channels of the first semiconductor crystal being within the energy window and the energy of the one anode channel of the second semiconductor crystal being within the energy window:
            separating the two anode channels and the two cathode channels of the first semiconductor crystal into combinations of anode-cathode channel pairs;
            for each of the anode-cathode channel pairs of the first semiconductor crystal, determining a respective direction difference angle, each respective direction difference angle being determined via use of the one anode channel and one cathode channel of the second semiconductor crystal;
            determining from among the direction difference angles a determined one of the direction difference angles that has a smallest value; and
            setting as an initial interaction position of a photon a selected one of the anode-cathode channel pairs that corresponds to the determined direction difference angle that has the smallest value.

2. The system of claim 1, wherein each direction difference angle is determined using a respective Compton scattering angle.

3. The system of claim 2, wherein each Compton scattering angle is associated with a common anode of a respective one of the first semiconductor crystal and the second semiconductor crystal and therefore have a same value.

4. The system of claim 3, wherein each respective Compton scattering angle is determined as:

$$\theta_E = \cos^{-1}\left(1 - mc^2\left(\frac{1}{E_s} - \frac{1}{E_i}\right)\right)$$

where $mc^2$ is photon rest energy, $E_i$ is incident photon energy, and $E_s$ is scattered photon energy.

5. The system of claim 4, wherein the determining each respective direction difference angle further comprises determining a respective angle $\theta_p$.

6. The system of claim 5, wherein:
each respective angle $\theta_p$ is determined as:

$$\theta_p = \cos^{-1}\left(\frac{A \cdot B}{|A \cdot B|}\right)$$

where A and B are the vectors of incident and scattered photons.

7. The system of claim 6, wherein each respective direction difference angle (DDA) is determined as:

DDA=|respective Compton scattering angle−respective angle $\theta_p$|.

8. The system of claim 1, wherein each of the first semiconductor crystal and the second semiconductor crystal comprises first cadmium zinc telluride (CZT).

9. The system of claim 8, wherein the first semiconductor crystal is part of a first detector, wherein the second semiconductor crystal is part of a second detector, and wherein each of the first detector and the second detector is 3D position sensitive.

10. The system of claim 1, wherein the operations further comprise utilizing the selected one of the anode-cathode channel pairs in an image processing operation.

11. The system of claim 10, wherein the image processing operation comprises positron emission tomography (PET).

12. A system, comprising:
a plurality of semiconductor crystals, each of the semiconductor crystals having a respective cross-strip electrical pattern with a plurality of anode channels and a plurality of cathode channels;
a processing system including a processor; and
a memory that stores executable instructions that, when executed by the processing system, facilitate performance of operations, the operations comprising:
measuring in a first one of the semiconductor crystals one or more anode channels and one or more cathode channels and measuring in a second one of the semiconductor crystals one or more anode channels and one or more cathode channels;
determining whether an energy of a sum of the one or more anode channels of the first semiconductor crystal is within an energy window;
determining whether an energy of a sum of the one or more anode channels of the second semiconductor crystal is within the energy window;
responsive to the energy of the sum of the one or more anode channels of the first semiconductor crystal being within the energy window and the energy of the sum of the one or more anode channels of the second semiconductor crystal being within the energy window:
separating the one or more anode channels and the one or more cathode channels of the first semiconductor crystal into first combinations of anode-cathode channel pairs;
separating the one or more anode channels and the one or more cathode channels of the second semiconductor crystal into second combinations of anode-cathode channel pairs;
creating a plurality of sequences of interaction points from the first combinations of anode-cathode channel pairs of the first semiconductor crystal;
creating a plurality of sequences of interaction points from the second combinations of anode-cathode channel pairs of the second semiconductor crystal;
for each of the plurality of sequences in the first semiconductor crystal, determining a respective direction difference angle via use of each of the plurality of sequences of the second semiconductor crystal;
determining from among the direction difference angles a determined one of the direction difference angles that has a smallest value; and
setting, as initial interaction positions of photons, selected ones of the anode-cathode channel pairs that correspond to a sequence that has the determined direction difference angle that has the smallest value.

13. The system of claim 12, wherein the initial interaction position is used in an image reconstruction process.

14. The system of claim 13, wherein the image reconstruction process comprises image processing of data to produce an image of all or part of a human subject.

15. The system of claim 14, wherein the data is a result of positron emission tomography (PET).

16. A non-transitory machine-readable storage medium comprising executable instructions that, when executed by a processing system including a processor, facilitate performance of operations, the operations comprising:
measuring in a first crystal two or more channels and measuring in a second crystal one or more channels;
determining whether an energy of a sum of the two or more channels of the first crystal is within an energy window;
determining whether an energy of a sum of the one or more channels of the second crystal is within the energy window;
responsive to the energy of the sum of the two or more channels of the first crystal being within the energy window and the energy of the sum of the one or more channels of the second crystal being within the energy window:
creating a plurality of sequences of interaction points from the two or more channels of the first crystal;
creating one or more sequences of interaction points from the one or more channels of the second crystal;
for each of the plurality of sequences in the first crystal, determining a respective direction difference angle via use of each of the one or more sequences of the second crystal;
determining from among the direction difference angles a determined one of the direction difference angles that has a smallest value; and
setting, as initial interaction positions of photons, selected ones of the channels that correspond to a sequence that has the smallest direction difference angle.

17. The non-transitory machine-readable storage medium of claim 16, wherein:
each of the first crystal and the second crystal is one of a semiconductor crystal or an inorganic scintillator crystal; and
the setting comprises storing the selected ones of the channels in a memory.

18. The non-transitory machine-readable storage medium of claim 16, wherein the operations further comprise image processing, and wherein the selected ones of the channels are used in the image processing.

19. The non-transitory machine-readable storage medium of claim 18, wherein the image processing produces an image of all or part of a human subject.

20. The non-transitory machine-readable storage medium of claim 18, wherein the image processing utilizes data from positron emission tomography (PET).

* * * * *